United States Patent
Matsui

(10) Patent No.: US 8,390,098 B2
(45) Date of Patent: Mar. 5, 2013

(54) SEMICONDUCTOR DEVICE PROVIDING A FIRST ELECTRICAL CONDUCTOR AND A SECOND ELECTRICAL CONDUCTOR IN ONE THROUGH HOLE AND METHOD FOR MANUFACTURING THE SAME

(75) Inventor: Satoshi Matsui, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 123 days.

(21) Appl. No.: 13/102,749

(22) Filed: May 6, 2011

(65) Prior Publication Data

US 2011/0210426 A1    Sep. 1, 2011

Related U.S. Application Data

(62) Division of application No. 11/168,388, filed on Jun. 29, 2005, now Pat. No. 7,964,972.

(30) Foreign Application Priority Data

Jun. 30, 2004 (JP) ................. 2004-194924

(51) Int. Cl.
*H01L 29/40* (2006.01)

(52) U.S. Cl. ......... 257/621; 257/E21.597; 257/E21.575; 257/E21.627; 257/E21.641; 257/E29.112; 257/758; 257/774

(58) Field of Classification Search ............ 257/758, 257/774, 621, E21.597, E21.575, E21.627, 257/E21.641, E29.112, E21.649
See application file for complete search history.

(56) References Cited

U.S. PATENT DOCUMENTS

| | | | |
|---|---|---|---|
| 4,810,669 A * | 3/1989 | Kobayashi | 438/699 |
| 5,262,662 A | 11/1993 | Gonzalez et al. | |
| 5,514,908 A * | 5/1996 | Liao et al. | 257/751 |
| 5,793,076 A * | 8/1998 | Fazan et al. | 257/298 |
| 6,005,291 A | 12/1999 | Koyanagi et al. | |
| 6,565,730 B2 | 5/2003 | Chakravorty et al. | |
| 6,611,039 B2 * | 8/2003 | Anthony | 257/529 |
| 6,720,245 B2 * | 4/2004 | Stucchi et al. | 438/614 |
| 7,030,481 B2 * | 4/2006 | Chudzik et al. | 257/700 |
| 7,033,934 B2 | 4/2006 | Iijima et al. | |
| 7,112,840 B2 * | 9/2006 | Kim et al. | 257/308 |
| 7,339,192 B2 * | 3/2008 | Nishiki et al. | 257/72 |
| 7,811,905 B2 * | 10/2010 | Kim | 438/478 |

FOREIGN PATENT DOCUMENTS

| | | |
|---|---|---|
| JP | 10-223833 A | 8/1998 |
| JP | 11-251316 A | 9/1999 |
| JP | 2002-009193 A | 1/2002 |
| JP | 2002-043502 A | 2/2002 |
| JP | 2002-170904 A | 6/2002 |
| JP | 2002-289623 A | 10/2002 |
| WO | 02/078087 A2 | 10/2002 |
| WO | 03/049194 A1 | 6/2003 |

* cited by examiner

*Primary Examiner* — Marcos D. Pizarro
*Assistant Examiner* — Bilkis Jahan
(74) *Attorney, Agent, or Firm* — Sughrue Mion, PLLC

(57) ABSTRACT

A semiconductor device 100 is provided with a multiplex through plug 111 that fills an opening extending through the silicon substrate 101. The multiplex through plugs 111 comprises a column-shaped and solid first through electrode 103, a first insulating film 105 that covers the cylindrical face of the first through electrode 103, a second through electrode 107 that covers the cylindrical face of the first insulating film 105 and a second insulating film 109 that covers the cylindrical face of the second through electrode 107, and these have a common central axis. The upper cross sections of the first insulating film 105, the second through electrode 107 and the second insulating film 109 are annular-shaped.

8 Claims, 15 Drawing Sheets

SEMICONDUCTOR DEVICE PROVIDING A FIRST ELECTRICAL CONDUCTOR AND A SECOND ELECTRICAL CONDUCTOR IN ONE THROUGH HOLE AND METHOD FOR MANUFACTURING THE SAME

CROSS-REFERENCE TO RELATED APPLICATION

This application is a divisional of U.S. patent application Ser. No. 11/168,388 filed Jun. 29, 2005, which is based upon and claims the benefit of priority from Japanese Patent Application No. 2004-194924, filed Jun. 30, 2004, the contents of all of which are incorporated herein by reference in their entirety.

BACKGROUND OF THE INVENTION

1. Field of the Invention

The present invention relates to a semiconductor device comprising a through electrode and method for manufacturing thereof.

2. Related Art

In recent years, semiconductor chips (hereinafter referred to as simply "chips") having very large scale integrated circuit (VLSI) are frequently employed for forming critical portions in computers and communication devices. A structure of forming a multi-layered component by forming a plurality of chips or a structure of coupling the chips to the interconnect board via a flip-chip coupling is often employed among the usages of such chips. A technique for providing an electrical conduction between the front side and back side of the chip is critical, in the case that a plurality of chips are employed to form a multi-layered component or the chip is flip-chip coupled. Conventional semiconductor devices comprising through electrodes that provide an electrical conduction between the front side and back side of the chip are described in, for example, Japanese Patent Laid-Open No. 1998-223, 833 (H10-223,833), Japanese Patent Laid-Open No. 2002-170,904, Japanese Patent Laid-Open No. 2002-289,623 and Japanese Patent Laid-Open No. 2002-43,502.

Japanese Patent Laid-Open No. 1998-223,833 describes a method for electrically coupling a main face to a back face of a chip by forming a coupling plug consisting of a metal in the semiconductor substrate having wiring elements collectively formed on the surface thereof. The coupling plug is composed of a metal plug disposed in a through hole and an insulating film interposed between the metal plug and the side wall of the through hole.

Japanese Patent Laid-Open No. 2002-170,904 describes a method for forming a through hole and a through electrode in the case that a chip is coupled via a chip size packaging (CSP) to form a multi-layered component. In the method described in Japanese Patent Laid-Open No. 2002-170,904, active elements or passive elements are collectively formed in the wafer level, and through holes for through electrodes are provided after a passivation layer is formed. The manufacturing of the through electrode is performed as follows. To form the through hole, a resist is applied on the entire face of the wafer, and the formed resist is partially removed to form openings using a photolithography technique, and then a dry etching or a wet etching is performed to form openings on the semiconductor substrate. Then, a seed layer is formed, and the photolithography technique is performed again, and then an electrolytic plating is performed.

Japanese Patent Laid-Open No. 2002-289,623 describes a method for providing a duplex insulation for a through electrode, for the purpose of preventing an insulation defect or a coupling defect to improve a connecting reliability. In such method, a narrow slit is provided so as to surround a section of the through electrode in a circumference of an opening having the through electrode disposed therein, when the semiconductor substrate is etched to form the through hole, and then the slit is completely filled using a process for coating with an insulating film for insulating the through electrode. The thickness of the semiconductor substrate is thinned until a bottom end of the slit is exposed in the process for thinning the film thickness, to form a semiconductor region electrically insulated from the substrate on the outside of the through electrode.

Japanese Patent Laid-Open No. 2002-43,502 describes a chip for a semiconductor device having an electrically insulated ring-type or annular Cu chip through plug. The ring-type Cu chip through plug is formed by forming a ring-shaped concave portion so that a convex Si wafer is remained therein, providing a Cu film on an insulating film covering each of the side faces and a bottom face of the concave portion, and filling the concave portion by performing an electrolytic plating technique from an origin of the Cu film. Japanese Patent Laid-Open No. 2002-43,502 also describes a configuration for forming a duplex slit via by a process, in which, the filling is not completed when a ring-shaped slit via is filled with Cu, and then slits of remained gaps are filled with an insulating material. It is described that the time required for filling the plug can be reduced by providing a ring-shaped geometry for the Cu chip through plug, as compared with the case of filling the circular concave portion.

SUMMARY OF THE INVENTION

However, it has now been discovered that these techniques described in the above related art documents have left rooms for improvement, in view of the following points.

When the through electrode is composed of a metal plug and a layer of an insulating film as in the technique described in Japanese Patent Laid-Open No. 1998-223,833, one through electrode corresponds to one through hole. Thus, when a plurality of through electrodes are required in some reason, it is necessary to provide through holes of the same number as the required number of through electrodes. Further, diameters of the through holes are particularly larger than the via diameter of the multi-layered interconnect layer that is on the order of submicron. In addition, in view of the reliability of the device, an active element and/or a passive element such as a transistor cannot be arranged in a certain region just above or in a circumference of the through electrode. Therefore, when the through electrode is provided, a region that cannot arrange any element is generated in the circumference of the through electrode including the portion of the through electrode. Thus, larger area of the region that cannot arrange any element is provided as larger number of the through electrodes are to be provided, and thus the miniaturization of the chip size is difficult.

Consider a case of forming a multi-layered DRAM as an exemplary case: when a bus width of a single-chip is, for example, 2,000 pins and three layers are formed, 6,000 through electrodes are required in the lowest layer of the chip. Further, when the interval between the through holes is 30 micron, for example, an area for through electrode portion that is required, is 2.3 mm-square, as converting to a square. This is nearly equal to 10% of an area of a usual DRAM in the conventional semiconductor device, and thus this can be a constraint on the miniaturization of the chip. Further, when the required number of the signal lines for a power supply, grounding (GND) and a clock is additionally considered, the above value of area is not realistic as a space for disposing the through electrodes in the chip.

Further, although the electrical conductive film on the face is removed via a chemical mechanical polishing (CMP) after completing the plating technique according to the manufacturing method disclosed in Japanese Patent Laid-Open No. 1998-223,833, the performing the CMP technique causes a problem of increasing a manufacturing cost, as slurry is wasted after every wafer is polishing.

In addition, the technique described in Japanese Patent Laid-Open No. 2002-170,904 is aimed for providing the through electrodes for interconnects in the CSP, after forming integrated circuit in wafer level is completed, and the interval between the through electrodes is further larger, as compared with a case of providing the through electrodes within the integrated circuit. Thus, it is difficult to provide the through electrodes at higher density.

In the technique described in Japanese Patent Laid-Open No. 2002-289,623, a duplex insulation of the through electrode from the semiconductor substrate is provided for the purpose of achieving an improvement in the connecting reliability. However, larger area of the through hole is required in this method than that required for the technique described in Japanese Patent Laid-Open No. 1998-223,833, and thus it is extremely difficult to provide the through electrodes at higher density. In addition, if the outer semiconductor in the duplex constitution is electrically coupled to the central signal line to be in equipotential therewith, contact area between the outer semiconductor substrate and the through electrode is increased to cause an increase in a parasitic capacitance of the interconnect.

Further, a problem caused commonly in the techniques described in Japanese Patent Laid-Open No. 1998-223,833, Japanese Patent Laid-Open No. 2002-170,904 and Japanese Patent Laid-Open No. 2002-289,623 is a difficulty in arranging the through electrodes at higher density. This is because only one through electrode is provided in one through hole in these techniques. In addition, while a cross talk noise between the through electrodes or between the through electrode and the integrated circuit is generated as the density of the formed through electrodes is increased, no other measure is presented for preventing the generation of the cross talk than a method of providing an increased distance between the through holes to reduce the density of the through electrodes in the methods described in the above-described documents. Similarly, while an electro magnetic interference (EMI) is generated as the through electrode density is increased and the clock number is enhanced, no measure for preventing the emission of EMI is proposed. Furthermore, since the power supply/GND are provided via a through hole which is different from the through hole for the signal interconnect, a voltage drop referred to as "IR drop" is generated in a region remote from the power supply/GND pin in the chip. In particular, the power supply/GND must be supplied from the outside of the signal interconnect region, when the through electrodes for signal are collectively arranged with narrow intervals, and thus the generation of IR drop can not be avoided.

In the technique described in Japanese Patent Laid-Open No. 2002-43,502, the slit via is employed exclusively for the purpose of improving the filling capability, and the shape of the slit is changed from a rectangle to combined rectangles or a ring-shaped, in order to increase area of a chip-coupling region. Although reduction of the filling time is anticipated according to such method, the contact area between the side wall of the through electrode and the semiconductor substrate is increased, and therefore an increase of the parasitic capacitance in the through electrode can not be avoided. In addition, a use of a ring-shaped or a crisscross-shaped through electrode increases the area of the through electrode, and thus arranging the through electrodes with higher density is difficult. An embodiment of forming duplex rings is included in the Japanese Patent Laid-Open No. 2002-43502 as an embodiment of the ring-shaped through electrode, which is performed by depositing Cu on an interior wall of a ring-shaped slit via once, and thereafter filling the remained concave portion with polyimide, and then partially removing the semiconductor substrate from the back face thereof to expose the polyimide layer, thereby providing an insulation between the Cu film remaining in the inside of the slit and the Cu film remaining outside of the slit. However, since only one Cu deposition process is performed in this embodiment, film thicknesses of the inside Cu film and the outside Cu film cannot be controlled respectively, and different materials cannot be employed for the inside Cu film and the outside Cu film. An increase of the filling time depending on the film thickness is also caused.

Since the method for filling in the technique described in Japanese Patent Laid-Open No. 2002-43,502 is an application of a known method for filling a rectangle slit via, a columnar portion of the semiconductor substrate must be remained in the center during the process for forming the via, in order to form the Cu ring in the inside thereof, and therefore this is incompatible with the requirement of reducing the area required for arranging the through electrodes. In addition, even though an improvement in the high frequency characteristics is found when the outer interconnect is at a constant potential, when the thickness of the inner Cu film is increased for reducing the resistance of the inner through electrode, the outer film thickness is also correspondingly increased, and therefore the area for the through electrodes is increased as being proportional to square of the film thickness. Moreover, since the concave portion of Cu is filled with the applied film, the film thickness of the insulating film between interconnects can not be controlled at a level of several nanometers, and it is also impossible to dispose each of the two ring-shaped through electrodes in a vicinity position via an extremely thin insulating film having a thickness of several tens nanometers. On the other hand, since it is also difficult to uniformly fill the concave potion with the insulating film covering the bottom of the slit via by a method except providing thicker applied film to completely fill thereof, it is not possible to reduce the interval between the through electrodes to a level smaller than a certain limitation.

As such, there is a concern that the parasitic capacitance of the through electrode comprising the through plug is increased when the configuration described in Japanese Patent Laid-Open No. 2002-43,502 is employed, in which the Si wafer is partially remained in the inside of the ring-shaped Cu chip through plug. Further, since the Cu film is deposited from both side faces of the ring-shaped concave portion in the technique described in Japanese Patent Laid-Open No. 2002-43,502, a predetermined margin of thickness is required for selecting the film thickness of the Cu chip through plug, and therefore it is difficult to sufficiently reduce the thickness of the Cu film.

Further, according to the manufacturing methods disclosed in Japanese Patent Laid-Open No. 1998-223,833, Japanese Patent Laid-Open No. 2002-170,904, and Japanese Patent Laid-Open No. 2002-43,502, wider width of the through hole to be filled provides longer filling time when the through hole is filled via a plating technique or a chemical vapor deposition (CVD). In particular in the electrolytic plating technique, the plated metal is easily pinched off at the upper end of the opening to be stuffed up in the case of having larger aspect ratio to generate unwanted voids therein, and therefore it is necessary to add expensive additives to a plating solution and reduce the current density for the plating so as to fill thereof at a lower filling rate. Therefore, only a lower throughput is achieved in the plating process (for example, about 12 hours is required for plating one piece in the case of the diameter of 5 micron and the aspect ratio of 7), and thus the plating process in this case is a process that requires higher costs.

According to the present invention, there is provided a semiconductor device, comprising: a semiconductor substrate; a solid plug-shaped first electrical conductor extending through the semiconductor substrate; a pipe-shaped second electrical conductor, being provided in a circumference of the first electrical conductor, and extending through the semiconductor substrate; and an insulating film, being provided between the first electrical conductor and the second electrical conductor, and providing an electrical insulation between the first electrical conductor and the second electrical conductor.

The semiconductor device according to the present invention includes the configuration of providing the first electrical conductor and the second electrical conductor respectively in one through hole that extends through the semiconductor substrate. The electrical conductors are electrically insulated by the insulating film. Thus, a plurality of through electrodes can be provided in the through hole, and therefore, the through electrodes can be disposed within a very small area at higher density. Further, the first electrical conductor and the second electrical conductor may be employed as a plurality of separated interconnects. Thus, the through electrodes provided in one through hole can be multi-functioned.

The semiconductor device according to the present invention is not limited to devices having elements such as a memory, a transistor and the like formed therein, and the device may have a configuration comprising a through electrode extending through the semiconductor substrate. For example, a semiconductor device according to the present invention may include a silicon interposer.

According to the present invention, there is provided a semiconductor device, comprising: a semiconductor substrate; a solid plug-shaped insulating plug extending through the semiconductor substrate; a pipe-shaped first electrical conductor, covering a circumference of the insulating plug, and extending through the semiconductor substrate; a pipe-shaped second electrical conductor, being provided in a circumference of the first electrical conductor, and extending through the semiconductor substrate; and an insulating film, being provided between the first electrical conductor and the second electrical conductor, and providing an electrical insulation between the first electrical conductor and the second electrical conductor.

The semiconductor device according to the present invention includes the configuration of providing the separated first electrical conductor and second electrical conductor respectively in one through hole extending through semiconductor substrate. Thus, the through electrodes comprising the first electrical conductor and the second electrical conductor can be arranged within a very small area at higher density. Further, since the geometries of the first electrical conductor and the second electrical conductor are both pipe-shaped geometry, the configuration presenting better filling characteristics with the electrical conductor during the manufacture of the through electrode can be achieved.

The semiconductor device according to the present invention may include a configuration, which further comprises an outer insulating film, which is provided between the second electrical conductor and the semiconductor substrate and separates between the second electrical conductor and the semiconductor substrate. Having such configuration, the insulation between the second electrical conductor and the semiconductor substrate can be ensured. Further, the geometry of the outer insulating film may be a cylinder extending through the semiconductor substrate.

The semiconductor device according to the present invention may include a configuration, in which the first electrical conductor is composed of a material, which is different from a material for composing the second electrical conductor. Having such configuration, the through electrode comprising the first electrical conductor and the second electrical conductor can be sophisticated.

The semiconductor device according to the present invention may include a configuration, in which the first electrical conductor and the second electrical conductor are electrically coupled to different interconnects respectively. In this occasion, a configuration can be presented, in which sum of an area of the first electrical conductor and an area of the second electrical conductor on the face of the semiconductor substrate is smaller than that corresponding to the case of "one interconnect-one through hole configuration" provided with a solid insulating component having an area equivalent to the area of the first electrical conductor from the upper viewpoint and a solid electrical conductor having an area equivalent to the area of the second the electrical conductor from the upper viewpoint. Thus, the through electrode can be arranged at higher density, while achieving the reduction of the area required for forming the through electrodes.

The semiconductor device according to the present invention may include a configuration, in which a pipe-shaped electrical conductor containing at least the second electrical conductor is formed through the insulating film in the circumference of the first electrical conductor by taking a central axis of a through hole extending through the semiconductor substrate as an axis of the pipe-shaped electrical conductor, and a material of the outermost pipe-shaped electrical conductor is material having the highest melting point among a material for the first electrical conductor and materials for the pipe-shaped electrical conductor. Having such configuration, the electrical conductor of the material having higher melting point may function as a barrier film, and thus a deterioration in the characteristics of the semiconductor device due to a diffusion of an easily-diffusing material contained in the interior of the through electrode into the semiconductor substrate can be prevented.

The semiconductor device according to the present invention may include a configuration, which further comprises an extra semiconductor substrate provided with a conductive component, which is coupled to the first electrical conductor or the second electrical conductor provided in the semiconductor substrate. Having such configuration, the conductive component provided between a plurality of semiconductor substrates can be surely coupled.

The semiconductor device according to the present invention may include a configuration, which further comprises a through electrode comprising the first electrical conductor and the second electrical conductor, wherein a potential of the second electrical conductor is fixed at a supply potential or a ground potential, and the second electrical conductor is electrically coupled to a ground plane covering the semiconductor device. Having such configuration, a cross talk noise or an electro magnetic interference (EMI) of the semiconductor device can be inhibited.

According to the present invention, there is provided a method for manufacturing a through electrode, comprising:

providing an opening on a face of a semiconductor substrate; forming a pipe-shaped first electrically conductive film along an interior wall of the opening; forming a pipe-shaped insulating film in the inside of the first electrically conductive film; filling the interior of the insulating film with a second electrically conductive film; and polishing or etching the other face of the semiconductor substrate to expose the first electrically conductive film and the second electrically conductive film.

According to the present invention, there is provided a method for manufacturing a through electrode, comprising: providing an opening on a face of a semiconductor substrate; forming a pipe-shaped first electrically conductive film along an interior wall of the opening; forming a pipe-shaped first insulating film in the inside of the first electrically conductive film; forming a second electrically conductive film in the inside of the first insulating film; filling the interior of the second electrically conductive film with a second insulating film; and polishing or etching the other face of the semiconductor substrate to expose the first electrically conductive film and the second electrically conductive film.

According to the present invention, the semiconductor device having the through electrode can be stably manufactured with a simple process. The first electrically conductive film and the second electrically conductive film are deposited using separate and independent processes. Thus, higher degree of flexibility in selecting materials and/or characteristics for the first electrically conductive film and the second electrically conductive film can be presented, and thus the method that enables a sophistication of the through electrode having the first electrically conductive film and the second electrically conductive film is presented.

The method according to the present invention may include a process, in which further comprises forming a multi-layered structure having equal to or more than three layers by repeating the process that is formed the insulating film and the conductive film in this sequence inside the second electrically conductive film after forming the second electrically conductive film. Having such process, a multiplex through electrode having a plurality of electrical conductor formed around a central axis thereof can be stably manufactured.

According to the present invention, there is provided a method for manufacturing a semiconductor device, comprising: providing an opening on a face of a semiconductor substrate; forming a pipe-shaped first electrically conductive film along an interior wall of the opening; forming a pipe-shaped insulating film in the inside of the first electrically conductive film; selectively removing the insulating film on the bottom of the opening by performing an anisotropic etching to expose the first electrically conductive film on the bottom portion; growing a second electrically conductive film on the first electrically conductive film exposed on the bottom portion using a plating technique; and polishing or etching the other face of the semiconductor substrate to expose the first electrically conductive film and the second electrically conductive film.

According to the present invention, the second electrically conductive film can be grown from the bottom portion of the opening toward an upper portion. Thus, a generation of voids in the second insulating film can be inhibited. Therefore, the electrically conductive film extending through the semiconductor substrate can be stably manufactured with higher manufacturing yield. In the method according to the present invention, the plating process may be an electrolytic plating process. The plating process may be a non-electrolytic plating process.

According to the present invention, a technique for providing through electrodes within a very small area at higher density in a semiconductor device having through electrodes can be achieved by providing a solid plug-shaped first electrical conductor extending through the semiconductor substrate; a pipe-shaped second electrical conductor, being provided in a circumference of the first electrical conductor, and extending through the semiconductor substrate; and an insulating film, being provided between the first electrical conductor and the second electrical conductor, and providing an electrical insulation between the first electrical conductor and the second electrical conductor.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments according to the present invention will be described as follows in further detail, in reference to the annexed figures. In all figures, identical numeral is assigned to an element commonly appeared in the figures, and the detailed description thereof will not be presented.

Figure 1:
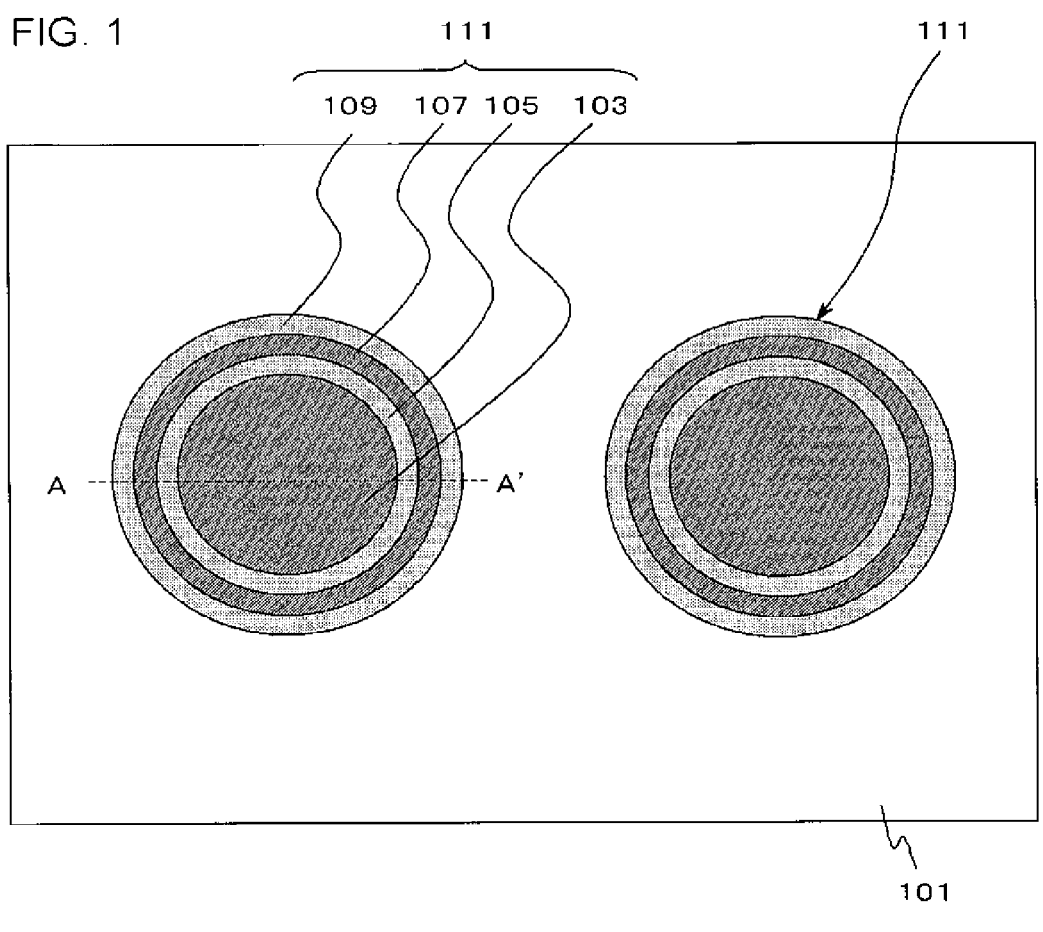
FIG. 1 is a plan view, schematically showing a configuration of a semiconductor device according to an embodiment of the present invention.

A semiconductor device 100 shown in FIG. 1 comprises a semiconductor substrate (silicon substrate 101), a solid plug-shaped first electrical conductor extending through the semiconductor substrate (first through electrode 103), a pipe-shaped second electrical conductor, being provided in a circumference of the first electrical conductor, and extending through the semiconductor substrate (second through electrode 107) and an insulating film, being provided between the first electrical conductor and the second electrical conductor and providing an electrical insulation between the first electrical conductor and the second electrical conductor (first insulating film 105).

Figure 10:
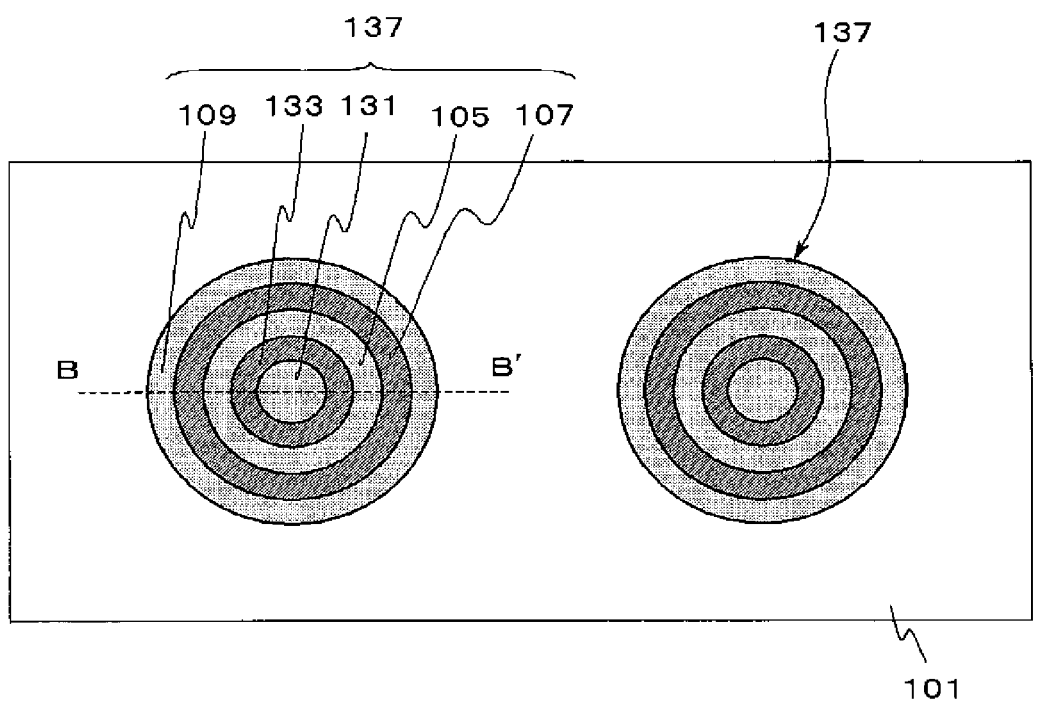
FIG. 10 is a plan view, schematically showing a configuration of a semiconductor device according to the embodiment of the present invention.

A semiconductor device 110 shown in FIG. 10 comprises a semiconductor substrate (silicon substrate 101), a solid plug-shaped insulating plug extending through the semiconductor substrate (third insulating film 131), a pipe-shaped first electrical conductor, covering a circumference of the insulating plug, and extending through the semiconductor substrate (first through electrode 133), a pipe-shaped second electrical conductor, being provided in a circumference of the first electrical conductor, and extending through the semiconductor substrate (second through electrode 107) and an insulating film, being provided between the first electrical conductor and the second electrical conductor, and providing an electrical insulation between the first electrical conductor and the second electrical conductor (first insulating film 105).

A method for manufacturing a through electrode illustrated in FIG. 3A to FIG. 3C and FIG. 4A to FIG. 4C includes: providing an opening (opening 113) on a face of a semiconductor substrate (silicon substrate 101); forming a pipe-shaped first electrically conductive film 163 along an interior wall of the opening; forming a pipe-shaped insulating film (first insulating film 105) in the inside of the first electrically conductive film 163; filling the interior of the insulating film with a second electrically conductive film 164; and polishing or etching the other face of the semiconductor substrate to expose the first electrically conductive film 163 and the second electrically conductive film 164.

Figure 12A:
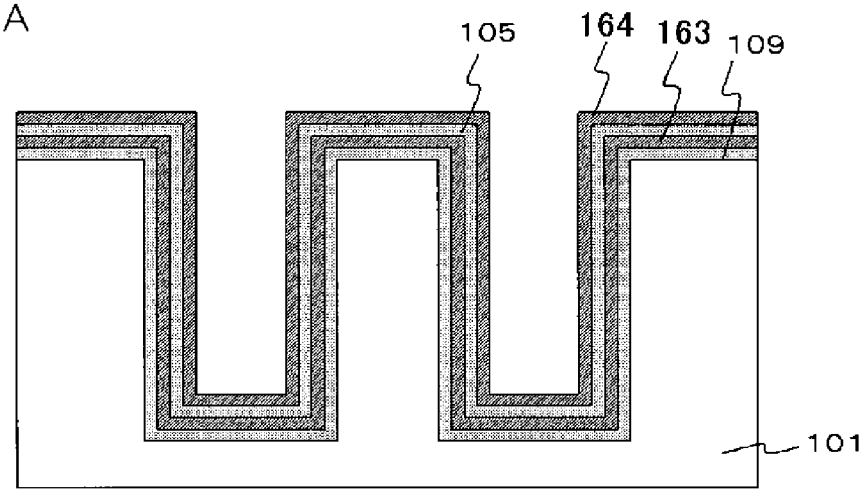
FIGS. 12A and 12B are cross-sectional views of the semiconductor device, schematically showing a process for manufacturing the semiconductor device according to the embodiment.
Figure 12B:
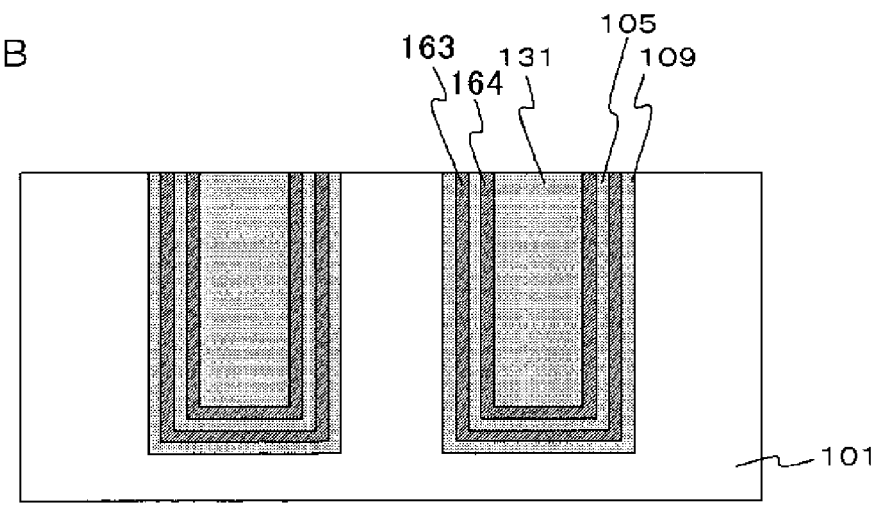

A method for manufacturing a through electrode illustrated in FIG. 3A to FIG. 3C, FIG. 4A and FIG. 12 A and FIG. 12B includes: providing an opening (opening 113) on a face of the semiconductor substrate (silicon substrate 101); forming a pipe-shaped first electrically conductive film 163 along an interior wall of the opening; forming a pipe-shaped first insulating film 105 in the inside of the first electrically conductive film 163; forming a second electrically conductive film 164 in the inside of the first insulating film 105; filling the inside of the second electrically conductive film 164 with a second insulating film (third insulating film 131); and polishing or etching the other face of the semiconductor substrate to expose the first electrically conductive film 163 and the second electrically conductive film 164.

A method for manufacturing the semiconductor device 100 illustrated in FIG. 3A to FIG. 3C, FIG. 4A and FIG. 6A to FIG. 6C includes: providing an opening (opening 113) on a face of a semiconductor substrate (silicon substrate 101); forming a pipe-shaped first electrically conductive film 163 along an interior wall of the opening; forming a pipe-shaped insulating film (first insulating film 105) in the inside of the first electrically conductive film 163; selectively removing the insulating film (first insulating film) on the bottom portion of the opening by performing an anisotropic etching to expose the first electrically conductive film 163 on the bottom portion; growing a second electrically conductive film 164 on the first electrically conductive film 163 exposed on the bottom portion using a plating technique; and polishing or etching the other face of the semiconductor substrate to expose the first electrically conductive film 163 and the second electrically conductive film 164.

(First Embodiment)

Figure 2:
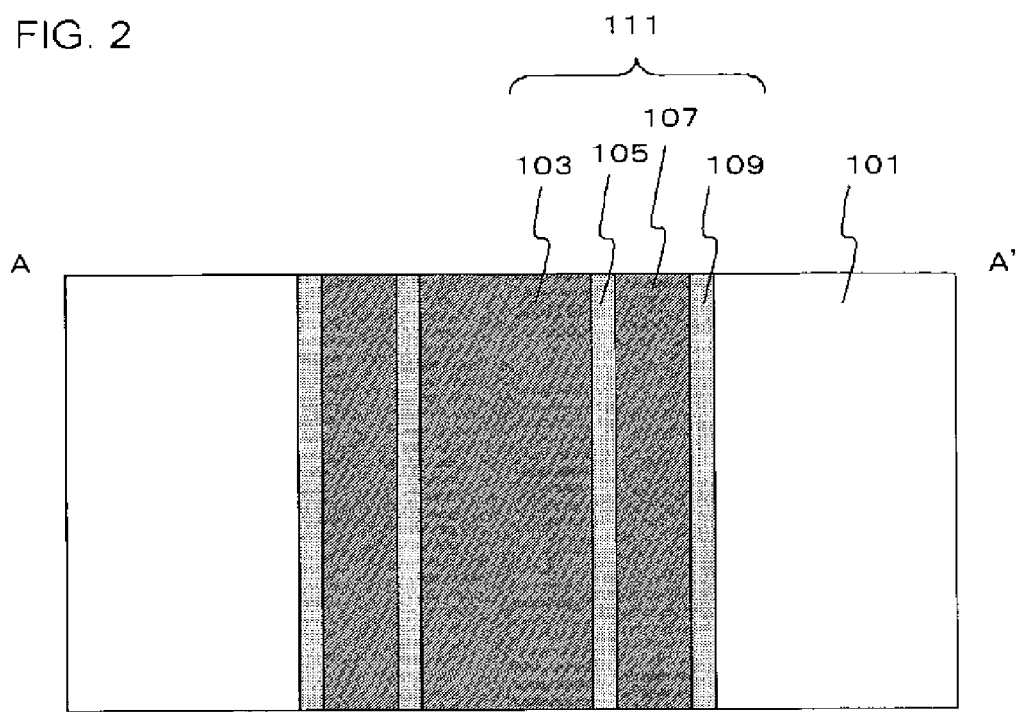
FIG. 2 is a cross-sectional view of the semiconductor device shown in FIG. 1 along a line A-A'.

The present embodiment relates to a semiconductor device provided with duplex through vias extending through the semiconductor substrate. FIG. 1 is a plan view, schematically showing a configuration of a semiconductor device according to the present embodiment. FIG. 2 is a cross-sectional view of FIG. 1 along the line A-A'.

A semiconductor device 100 shown in FIG. 1 and FIG. 2 includes a silicon substrate 101 and a multiplex through plug 111 that fills an opening that extends through the silicon substrate 101. The multiplex through plugs 111 comprises a columnar and solid first through electrode 103, a cylindrical first insulating film 105 that covers the cylindrical face of the first through electrode 103, a second through electrode 107 that covers the cylindrical face of the first insulating film 105 and a cylindrical second insulating film (outer insulating film) 109 that covers the cylindrical face of the second through electrode 107, and these component have a common central axis, and further, the upper cross sections of the first insulating film 105, the second through electrode 107 and the second insulating film 109 are ring-shaped.

The first through electrode 103 and the second through electrode 107 are composed of electrical conductors. Materials for the first through electrode 103 and the second through electrode 107 may be, for example, metals such as Cu, W, Ti, Al, Ni, Ta and the like, a metal silicide or a polysilicon. The first through electrode 103 and the second through electrode 107 may be composed of a common material, or may be composed of different materials. Further, the first through electrode 103 and the second through electrode 107 may be composed of same or different material(s) having same capacitance or resistance, or may be composed of materials having different capacities or resistances. A conductive component such as a bump or an interconnect may be coupled to the upper or the lower face of the first through electrode 103 or the first insulating film 105 as described later, though it is not shown in FIG. 1 or FIG. 2.

The first insulating film 105 and the second insulating film 109 function as barrier films for covering the side walls of the first through electrode 103 or the second through electrode 107, and inhibit the diffusion of metal compositions contained in these through electrodes into the silicon substrate 101. Materials for the first insulating film 105 and the second insulating film 109 functioning as the barrier film may be, for example, a nitride film such as SiN, SiON and the like, or an oxide film such as $SiO_2$ and the like. Further, a multi-layered film obtained by forming two or more layers of these films may also be employed. Functions as the barrier film can further be ensured by employing SiN, SiON or the like for the materials of the first insulating film 105 and the second insulating film 109. The first insulating film 105 and the second insulating film 109 may be composed of a common material, or may be composed of different materials. Further, the thickness of the first insulating film 105 and the second insulating film 109 may be, for example, equal to or higher than 10 nm. Having such configuration, the function as the barrier film can further be ensured.

While the configuration of providing two multiplex through plugs 111 in the silicon substrate 101 is illustrated in FIG. 1, number and arrangement of the multiplex through plugs 111 are not particularly limited, and may be suitably selected depending on the design of the semiconductor device 100. Alternatively, a plurality of through electrodes provided in the through hole are disposed in a coaxial arrangement, and the ring-shaped through electrodes may multiply surround the outside of the first through electrode 103 that fills the center of the through hole via the first insulating film 105. In addition, while the cross section of through electrode shown in FIG. 2 is rectangle, the cross section of through electrode may be shape that is not rectangle (for example, taper, reverse-taper and the like). Further, the two-dimensional shape of the columnar and solid first through electrode 103 is not limited to rectangular shape. For example, the two-dimensional shape of the columnar and solid first through electrode 103 may be a rectangle, an elliptic, a polygonal or the like. Further, the two-dimensional shape of the cylindrical second through electrode 107 is not limited to circular loop shape. For example, the two-dimensional shape of the cylindrical second through electrode 107 may be a rectangle, an elliptic loop, a polygonal loop or the like.

Next, the process for manufacturing the semiconductor device 100 will be described.

Figure 3A:
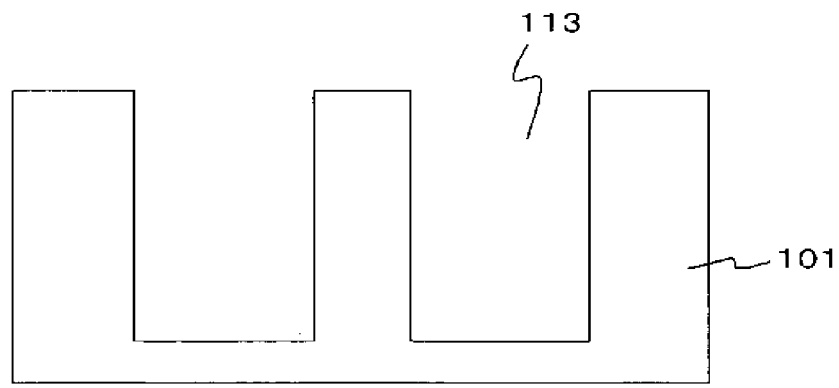
FIGS. 3A to 3C are cross-sectional views of the semiconductor device, schematically showing a process for manufacturing the semiconductor device according to the embodiment.

FIGS. 3A to FIG. 3C and FIG. 4A to FIG. 4C are cross-sectional views of the semiconductor device shown in FIG. 1 and FIG. 2, schematically illustrating a process for manufacturing the semiconductor device according to the embodiment. Firstly, the face of the silicon substrate 101 is patterned by employing a photolithography technique, so as to provide an opening at a position for providing the multiplex through plugs 111. Then, the silicon substrate 101 is etched to form opening 113 (FIG. 3A). Here, the opening 113 may be tapered so as to decrease the opening width from the face of the silicon substrate 101 toward the bottom thereof. Having such configuration, the filling of an electrically conductive film described later can be further ensured.

Figure 3B:
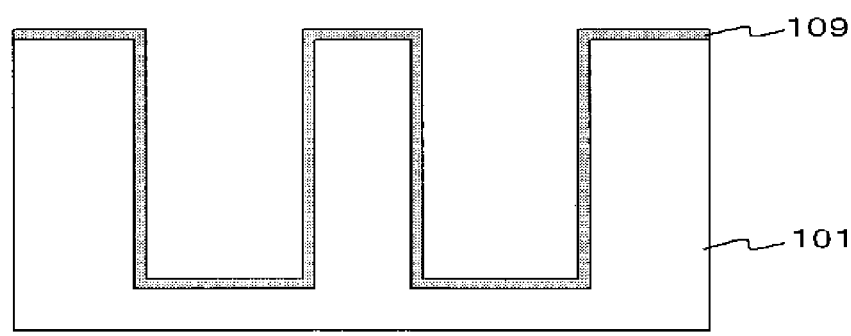

Thereafter, a second insulating film 109 is deposited on the entire face for forming the opening 113 of the silicon substrate 101 containing the side face and the bottom face of the opening 113 (FIG. 3B). When the insulating film 109 is, for example, an SiN film, the film may be formed with a thickness of on the order of 50 nm by a plasma chemical vapor deposition (plasma CVD).

Figure 4A:
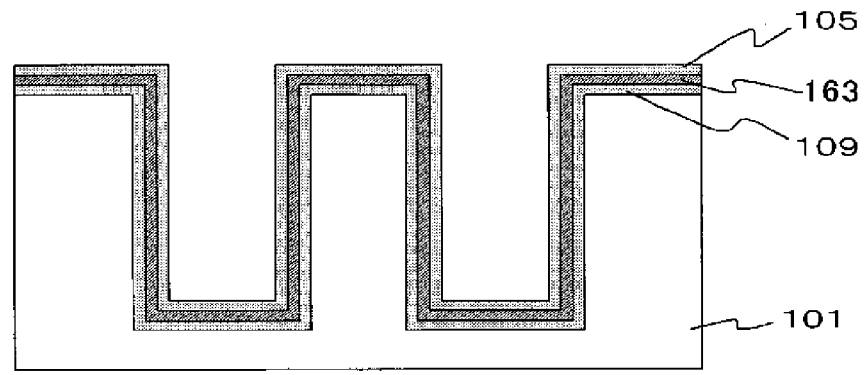
FIGS. 4A to 4C are cross-sectional views of the semiconductor device, schematically showing a process for manufacturing the semiconductor device according to the embodiment.

Subsequently, the first electrically conductive film 163, which will be the second through electrode 107, is deposited on the entire of the upper face of the second insulating film 109 using a CVD technique, for example. The electrically conductive film 163 may be, for example, a Cu film or the like. Then, the first insulating film 105 is deposited on the entire of the upper face of the first electrically conductive film 163 using a plasma CVD up to a thickness of on the order of 50 nm (FIG. 4A).

Subsequently, a metal seed film such as a seed Cu film (not shown in the drawings) is deposited on the entire of the upper face of the first insulating film 105. Thereafter, the second electrically conductive film 164, which will be the first through electrode 103, is deposited by a plating technique. In this occasion, the plating conditions are set so as to completely fill the opening 113. As such, the second electrically conductive film 164 of a Cu film, which will be the first through electrode 103, is formed.

Figure 4B:
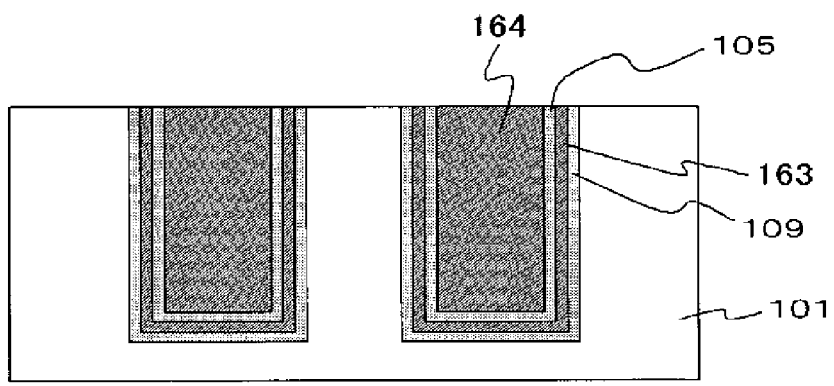

Next, the second insulating film 109, the second electrically conductive film 164, the first insulating film 105 and the first electrically conductive film 164 on the silicon substrate 101 are removed using a chemical mechanical polishing (CMP). In this occasion, the condition of CMP process is suitably selected and polished them so that the upper face of the first through electrode 103 is generally coplanar with the upper face of the silicon substrate 101. In the present embodiment, the second insulating film 109 may be removed by an etching technique after the CMP process (FIG. 4B).

Figure 4C:
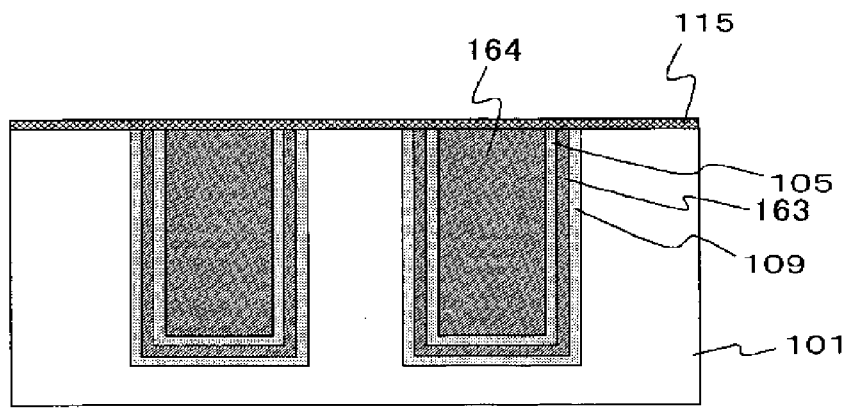

An insulating film may be deposited on the entire of the polishing face after the CMP process to form an interconnect layer 115 (an interconnect layer is defined as a layer in which an interconnect is provided in an insulating layer) having a predetermined interconnect by using, for example, a damascene process, though it is not shown in FIG. 1 and FIG. 2 (FIG. 4C). The interconnect layer may be mono-layered, or multi-layered. Further, in the region of the silicon substrate 101 except the interconnect layer 115, the second electrically conductive film 164 that will be the first through electrode 103 may be electrically insulated from the first electrically conductive film 163 that will be the second through electrode 107.

Next, the side of the polishing face thereof is fixed to a support component (not shown in the drawings) and a process for reducing (thinning) the thickness of the silicon substrate 101 is performed. The process for thinning the thickness may utilize a grinding process, a polishing process, an etching process or the like. For example, a back face grinding may be performed using a mechanical polishing. The thickness of the thinned silicon substrate 101 is appropriately selected depending on the device configuration of the semiconductor device 100, and the thickness of on the order of 20 to 400 μm may be employed, when the semiconductor device 100 is a silicon interposer, for example. Thereafter, the support component (not shown in the drawings) is removed off from the silicon substrate 101 to obtain the semiconductor device 100 shown in FIG. 1.

Since the semiconductor device 100 shown in FIG. 1 and FIG. 2 has multiplex through plugs 111, the semiconductor device 100 can be preferably utilized as a silicon interposer that is provided between a semiconductor chip having a logic circuit formed therein and a memory chip having a memory element such as a DRAM.

For example, the interposer is provided between the logic LSI and the DRAM in the multi-layered semiconductor device. Since the electrical conduction between the logic LSI and the DRAM can be achieved by utilizing the through electrode of the interposer in such multi-layered semiconductor device, advantageous effects such as an improvement in the processing rate and a reduction of the power consumption and the like can be obtained, as compared with the case of providing the electrical conduction between the elements by a wire bonding.

Further, the semiconductor device 100 may alternatively be a memory chip including a memory element such as DRAM and the like. Concerning the memory chip having larger number of the external terminals, the electrical couplings through the external terminals can be ensured by having a configuration comprising the multiplex through plug 111. In addition, the semiconductor device 100 may alternatively be a logic chip including a logic circuit element layer having transistors or the like formed therein.

Next, the advantageous effect obtainable by employing the semiconductor device shown in FIG. 1 and FIG. 2 will be described as follows.

The semiconductor device 100 shown in FIG. 1 and FIG. 2 comprises the multiplex through plugs 111 in which a plurality of signal pins, or in other words, the first through electrode 103 and the second through electrode 107, are embedded within one opening 113. By providing the multiplex through plug 111, the through electrodes can be arranged at higher density while reducing the number of the required through holes. Further, a sophistication of the through electrodes arranged at higher density can be achieved. For example, a reduction of the area for arranging the through electrodes, a reduction of the capacitance of the through electrode, a reduction of the crosstalk noise, a reduction of the EMI, a reduction of the IR drop, an improvement in the reliability and the like can be achieved. Further, additional functions for utilizing the multiplex through plug 111 itself as an element can also be provided. In addition, multiple functions can be provided to the multiplex through plug 111.

Since the semiconductor device 100 has the multiplex through plug 111, area of the region required for forming the through electrodes can be reduced. Thus, the arrangement of the through electrodes at higher density and within the reduced space can be achieved. Therefore, degree of flexibility in designing the semiconductor device is increased, and thus the semiconductor device have a configuration, in which smaller semiconductor device having a number of through electrodes can be stably manufactured.

Figure 5A:
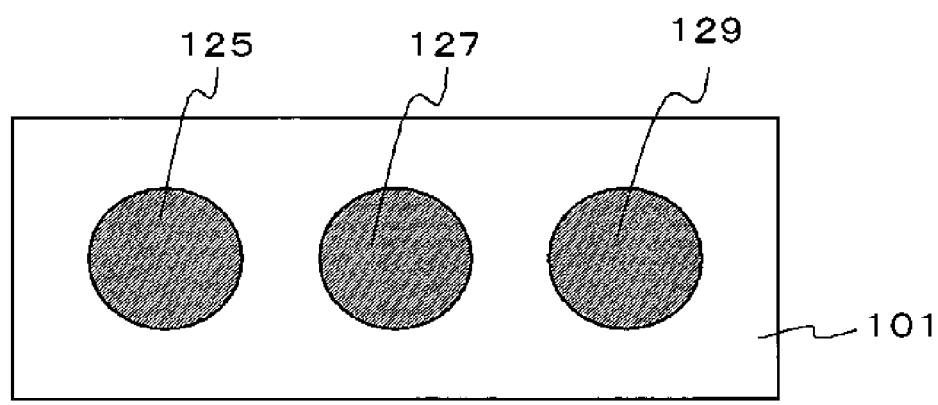
FIGS. 5A and 5B are plan views, schematically showing a configuration of a semiconductor device.
Figure 5B:
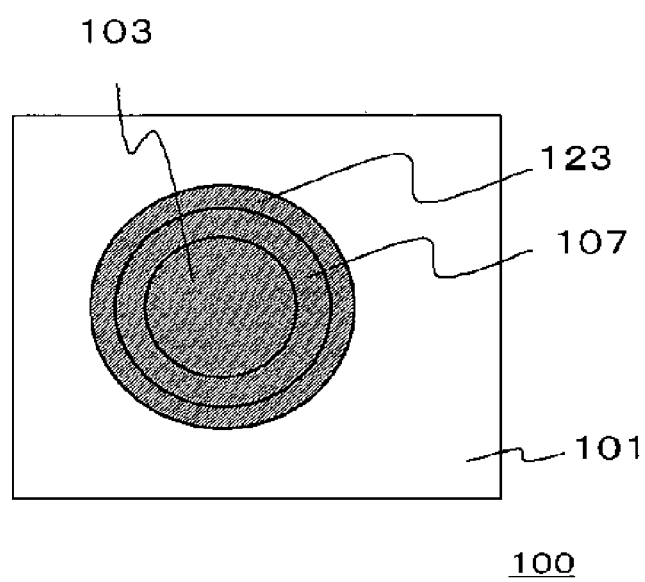

The areas of regions for forming the through plugs in the case of employing the multiplex through plug 111 and in the case of providing a plurality of through plugs in different regions can be compared as follows, for example. FIG. 5A is a plan view, schematically showing a silicon substrate 101 that is separately provided with three through plugs, that is, a through plug 125, a through plug 127 and a through plug 129. FIG. 5B is a plan view, schematically showing a semiconductor device 100, a through multiple via has a triple-layered structure comprising, from the side of the inside, a first through electrode 103, a second through electrode 107 and a third through electrode 123. In FIG. 5A and FIG. 5B, an insulating film separating an electrical conductors is not shown. In FIG. 5A and FIG. 5B, it is assumed that the arrangement of the elements around the through plug is taken into consideration and that an "prohibited region to arrange element" area is a rectangular-shaped spaced apart from the through plugs at a certain distance, areas (D1, D2) of zones, in which the region of the through plugs occupy the face of the silicon substrate 101 of semiconductor device, are calculated, provided that: plug radius=1; distance between plugs=1; and region of through plug is presented as a rectangle, (plug diameter+distance between plugs+both sides margin (=2)) on a side, D1 is presented as:

$$D1 = 4 \times 10 = 40$$

for the configuration shown in FIG. 5A.

On the other hand, in the case of the triple-layered structure shown in FIG. 5B, D2 is presented as:

$$D2 = \{2 \times (3)^{2/1} + 2\}^2 = 29.9.$$

From these results, the comparison between D1 and D2 is presented as:

$$(D1 - D2)/D1 = 0.25,$$

and thus it is understandable that the area for the through plugs can be reduced by 25% in an area ratio, by employing configuration having the multiplex plug shown in FIG. 5B, as compared with the case of the parallel arrangement. As such, the area occupied by the region for forming the through plugs in the semiconductor device 100 can be reduced by providing the multiplex through plugs 111 having an electrically conductive plug of two layers or more. In addition, further effect of reducing the area can be obtained by adjusting interval of electrodes in the multiplex through plugs 111 or the arrangement of the multiplex through plugs 111.

In addition, the multiplex through plug 111 can be effectively manufactured by a simple and easy method by employing the configuration of the semiconductor device 100 shown in FIG. 1 and FIG. 2. In addition, since the constituting components of the multi-layered structure that is embedded in the opening 113 is formed sequentially from the component of the outer side to the component of the inside, defect in the filling such as generating voids in the first through electrode 103 can be inhibited, the solid first through electrode 103 can be stably manufactured.

In the semiconductor device described in the above-described Japanese Patent Laid-Open No. 2002-43,502, through electrodes having a configuration for forming a duplex slit via are provided. Since the duplex slit via described in Japanese Patent Laid-Open No. 2002-43,502 is formed by growing the electrically conductive film from both sides of the slit via, the solid and columnar silicon substrate must be inherently remained in the interior of the electrically conductive film. On the contrary, in the semiconductor device 100 according to the present embodiment, the multiplex through plug 111 comprising the solid first through electrode 103 can be formed by providing the opening 113 in advance. Since the device has the configuration that the first through electrode 103 is solid and that does not allow the silicon substrate 101 remaining within the opening 113, the parasitic capacitance of the multiplex through plug 111 can be reduced. Therefore, the multiplex through plug 111 has better characteristics required for functioning as the through electrode, as compared with the conventional configuration.

When the electrically conductive film is grown from both sides of the slit via in the semiconductor device described in Japanese Patent Laid-Open No. 2002-43,502, the electrically conductive film is preferentially prone to grow in vicinity of the edge of the opening rather than in the interior of the silicon substrate. Thus, there is a concern that the defect of the filling with the insulating film maybe generated. On the contrary, since the first insulating film 105 is deposited on the entire face of the first through electrode 103 in the semiconductor device 100 according to the present embodiment, defect of the deposition is inhibited, and thereby presenting a configuration providing better manufacturing stability. Thus, the configuration that is capable of improving the manufacturing yield is presented.

Further, the first through electrode 103 is solid and plug-shaped in the semiconductor device 100. Thus, the connection of conductive components such as the connection of the bump to the end face of the first through electrode 103 can be stably performed at larger area, as compared with the semiconductor device described in Japanese Patent Laid-Open No. 2002-43,502. Thus, the coupling reliability between the first through electrode 103 and other conductive components can be improved.

Further, the semiconductor device 100 is manufactured by a "two-electrical conductor embedding process", in which an electrically conductive film that will be the first through electrode 103 and a metal film that will be the second through electrode 107 are separately embedded therein. Thus, the multiplex through plugs 111 comprising a plurality of through electrodes having different materials, different resistances or different capacities can be simultaneously manufactured. Further, new function can be added to the multiplex through plug 111. For example, the material for composing the first through electrode 103 may be different from the material for composing the second through electrode 107. On the other hand, in the semiconductor device described in the above-described Japanese Patent Laid-Open No. 2002-43, 502, different material cannot be employed for composing the duplex slit via. Since a plurality of materials for the through electrodes can be employed in the semiconductor device 100 according to the present embodiment, prevention for the diffusion of the material that composes the metal film can be ensured. Further, usage of a corrosive material can be selectively prevented. In addition, an adhesion at the interface between the materials composing the multiplex through plugs 111 can be improved.

Further, the multiplex through plug 111 can also be employed as passive element of LCR in the semiconductor device 100.

Figure 6A:
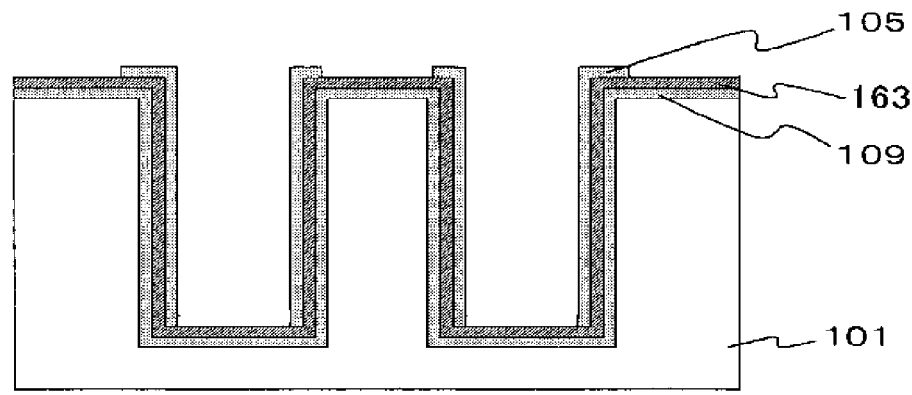
FIGS. 6A to 6C are cross-sectional views of the semiconductor device, schematically showing a process for manufacturing the semiconductor device according to the embodiment.
Figure 6B:
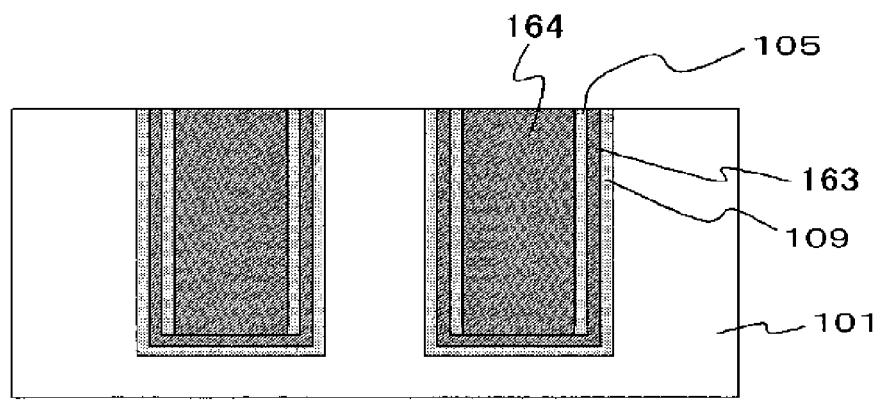
Figure 6C:
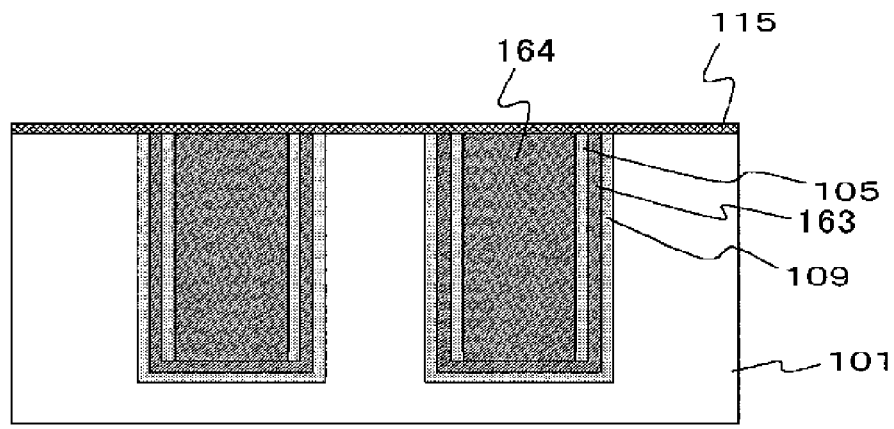

Alternatively, the semiconductor device 100 shown in FIG. 1 and FIG. 2 can also be manufactured by the following process. FIG. 6A to FIG. 6C are cross-sectional views, schematically illustrating another process for manufacturing the semiconductor device 100.

First, processes described in reference to FIG. 3A to FIG. 3C and FIG. 4A are performed to deposit the first insulating film 105 on the silicon substrate 101. Then, the first insulating film 105 covering the bottom face of the opening 113 and a portion of the first insulating film 105 provided on the upper face of the silicon substrate 101 are selectively removed by performing an anisotropic etching to expose an electrically conductive film (first electrically conductive film 163) on the bottom face of the opening 113, which will be the second through electrode 107 (FIG. 6A). Then, the electrically conductive film exposed on the bottom face of the opening 113 (first electrically conductive film 163) is utilized as seed, and a second electrically conductive film 164, which is a metal film that will be the first metals through electrode 103, is deposited on the bottom face thereof using a plating technique (FIG. 6B).

Then, similarly as in the case shown in FIG. 4C, an interconnect layer 115 (an interconnect layer is defined as a layer in which an interconnect is provided in an insulating layer) is provided on the exposed face of the multiplex through plug 111 (FIG. 6C). Then, the silicon substrate 101 is ground from the back face of the interconnect layer 115 to reduce the thickness thereof (to thin the silicon substrate 101), and the reduction of the thickness of the silicon substrate 101 is continued until the second electrically conductive film 164 that will be the first through electrode 103 is exposed. As such, the semiconductor device 100 shown in FIG. 1 and FIG. 2 is obtained.

According to this manufacturing method, the first through electrode 103 can be grown using the plating technique from the bottom portion of the opening 113 according to a bottom-up sequence during the forming the multiplex through plug 111. Since the second electrically conductive film 164 that will be the first through electrode 103 is grown according to the bottom-up sequence, generation of voids in the multiplex through plug 111 can be prevented. Thus, the semiconductor device having a plurality of multiplex through plugs 111 in one piece of the silicon substrate 101 can be stably manufactured at higher manufacturing yield. Further, the semiconductor device 100 comprising the multiplex through plugs 111 having further improved reliability can be manufactured.

Further, in this manufacturing method, the plating process proceeds toward one direction of from the lower portion to the upper portion. Thus, uniform filling can be achieved, regardless of the diameter of the opening 113. Further, since the plating process proceeds only in the interior of the opening 113 different from the ordinary plating technique for entire face, CMP process for removing the electrically conductive film covering the face of the silicon substrate 101 is not required. Therefore, the manufacturing cost can be reduced.

In the manufacturing method shown in FIG. 6A to FIG. 6C, an electrolytic plating may be employed as the plating for depositing the second electrically conductive film 164 that will be the first through electrode 103. In this case, since only the patterned portion is plated and void is not generated as compared with the plating for entire face, the current density or the duty ratio, or in other words, the ratio of the time to apply current in the total plating time, can be increased. Therefore, while duty ratio is, for example, equal to or less than 5% when the through electrode is formed by the conventional plating technique for the entire face, the manufacturing method according to the present embodiment can avoid the time not to apply current, and therefore the filling time can be dramatically reduced.

Further, in the manufacturing method shown in FIG. 6A to FIG. 6C, a non-electrolytic plating technique may be employed as the plating method for depositing the first through electrode 103. In such case, the plating process can be performed using a batch process, and therefore the first through electrode 103 can be deposited at higher throughput and with lower cost.

As such, by employing the manufacturing method shown in FIG. 6A to FIG. 6C, the throughput in the process of depositing the second electrically conductive film 164, which is an electrical conductor that will be the first through electrode 103, can be dramatically improved.

Further, in the semiconductor device 100, the opening 113 may be provided on the back face of the main face of the silicon substrate 101 to form the multiplex through plug 111 by the process described above. The outer second through electrode 107 can be easily led out from the back face onto the field by forming the multiplex through plug 111 from the back face. Thus, the bump forming or the rerouting can be performed with wider intervals, even in the case that the accuracy for arranging the interconnects in the back face does not correspond to the interval of the multiplex through plugs 111.

The semiconductor device 100 shown in FIG. 1 and FIG. 2 may be modified to present various versions.

For example, in the semiconductor device 100, each of the through electrodes that compose one through plug 111 of duplex or multiplex may be connected to different interconnects on the silicon substrate 101 respectively. For example, the first through electrode 103 may be coupled to an interconnect that is different from the interconnect coupled by the second through electrode. Having such configuration, a plurality of separated through electrodes can be obtained through a single through hole. Further, area of the silicon substrate 101 required for obtaining the through electrode having a predetermined resistance that is the same as the resistance described later can be reduced by a through hole interval, as compared with a case that a through electrode is formed in a through hole and coupled to an interconnect.

Further, when the resistance of the formed through electrode is sufficiently low, the through electrode may be formed to be multiplex and thinner as possible and connected to a signal line, thereby reducing the number of the through holes in inverse proportion to the number of layers for forming the multiplex through electrode (that is, the number of through electrodes in the multiplex through electrode). Further, the multi-chip semiconductor device can be provided with advanced functions by employing the multiplex through plug 111 to perform the multi routing. For example, the number of the through electrodes can be changed according to the device design in the multi-chip module, without increasing the number of vias in the multi-chip module.

Further, each through electrode of the through plugs 111 of duplex or multiplex can be connected to different interconnects respectively on the silicon substrate 101, such that the electric potentials of every other through electrodes or the electric potential of the outer most through electrode is fixed. Having such configuration, a cross talk noise or an electro magnetic interference (EMI) caused by a through electrode interposed with the through electrodes having fixed electric potential or by through electrodes surrounded by the through electrode having the fixed electric potential can be prevented. Further, an impedance matching of the signal lines may be possible depending on the configuration of the insulating film provided between the through electrodes.

Further, at least two adjacent through electrodes included in the through plug 111 of duplex or multiplex may be connected to different interconnects respectively on the silicon substrate 101. Having this configuration, a capacitor can be formed between two adjacent through electrodes through the insulating film disposed between interconnects. Having such configuration, the through electrode itself can be utilized as a passive element. In such case, a configuration of providing larger interconnect capacitance between two through electrodes that form a capacitor than a capacitance with the other through electrodes or with the silicon substrate 101, may be presented. Having this configuration, while the capacitor can have a higher capacitance, a generation of the parasitic capacitance between other through electrode can be inhibited.

Further, at least one of the through electrodes included in the through plug 111 of duplex or multiplex may be fixed to a supply potential or GND potential. In this case, a configuration, in which at least one of other through electrodes may be coupled to a signal line, can be presented. Since this configuration enables supplying a power supply or GND at a position equivalent to the signal interconnect, an IR drop can be prevented even if the through electrode for signal is collectively arranged with a narrow interval.

Further, the material for the outermost through electrode among the through electrodes included in the through plug 111 of duplex or multiplex may have the highest melting point among the materials for all the through electrodes. For example, when the material of the through electrode provided in the inner side is Cu, the material for the outermost through electrode may be a metal having higher melting point than Cu, or more specifically may be W or Ta, for example. This improves the manufacturing stability for the multiplex through plug 111. Further, the adhesion between the materials composing the multiplex through plug 111 may be improved. Further, the diffusion of the materials for the through electrodes disposed in the inside such as Cu to the silicon substrate 101 can be prevented.

Further, the through electrode may be a duplex through electrode as shown in FIG. 1 and FIG. 2, and one of the first through electrode 103 and the second through electrode 107 may be fixed at a supply potential, and the other may be connected to a ground potential, thereby forming a capacitor through the first insulating film 105. Such configuration may provide an utilization of the multiplex through plug 111 as a decoupling capacitor. In this case, the capacitance between the first through electrode 103 and the second through electrode 107 may be larger as possible and the capacitance between the second through electrode 107 and the silicon substrate 101 located on the outside of the second through electrode 107 may be smaller than the capacitance of the capacitor. In such occasion, for example, first insulating film 105 may be thinned or a material having higher dielectric constant may be employed for the material of the first insulating film 105. This helps increasing the interconnect capacitance.

Further, noises in the electrical voltages of the power supply and GND are controlled to provide a constant operation by composing the decoupling capacitor. In this case, in order to reduce, a capacitance in the signal line that does not compose a capacitor, the second through electrode 107 may be connected to the first through electrode 103 through an interconnect provided in an interconnect layer 115 on the silicon substrate 101 to provide a condition of being at an equipotential. In this occasion, even in the case that the interconnect capacitance is not particularly preferable for the decoupling capacitor, an IR drop can be inhibited since the number of the required through holes for the power supply and GND is reduced to a half. Moreover, reduction of the quantity of the required through holes for providing the through electrodes for being coupled to the power supply and GND may be achieved.

Further, the through electrode may be a duplex through electrode, and the second through electrode 107 may be fixed at a supply potential or at ground potential, and the second through electrode 107 may be coupled to an electrical conductor (that is, ground plane) having a fixed electric potential that covers the entire face of the semiconductor device 100. Having such configuration, the cross talk noise and EMI in the whole semiconductor device can be reduced.

Figure 3C:
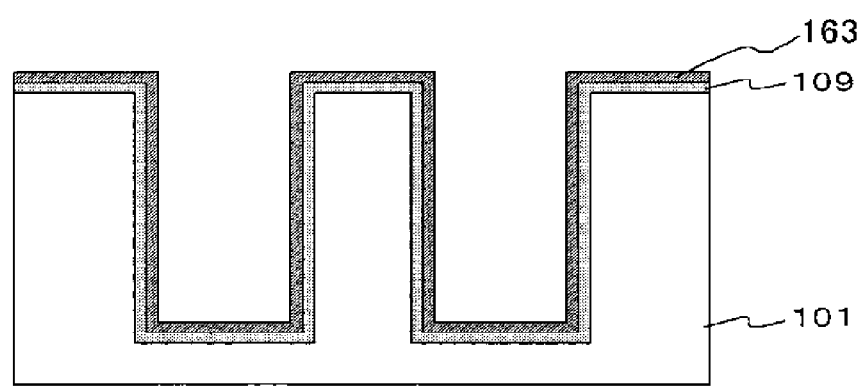

Since the multiplex through plug 111 comprises a duplex through electrode, the second through electrode 107 provided outside thereof can be coupled to the ground plane. Having such procedure, the multi-chip module having reduced EMI can be employed with a simple configuration. In addition, in such case, the metal film (the first electrically conductive film 163) deposited on the face of the silicon substrate 101 may be utilized for a ground plane as it is, after the process for depositing the metal film that will be the second through electrode 107 (FIG. 3C). Having such configuration, the second through electrode 107 and the ground plane being coupled thereto can be formed as a continuous and integral component by one process. Moreover, since only one CMP process is sufficient, a configuration which manufacturing process is simplified can be obtained.

In addition, the through electrode may be a duplex through electrode, the resistance of the second through electrode 107 may be higher than the resistance of the first through electrode 103, and the first through electrode 103 and the second through electrode 107 for all through holes may be coupled through the interconnect layer 115 provided on the main face or the back face of the silicon substrate 101 to provide a condition of an equipotential. Alternatively, only the first through electrode 103 may be coupled to the interconnect layer 115.

(Second Embodiment)

Figure 7:
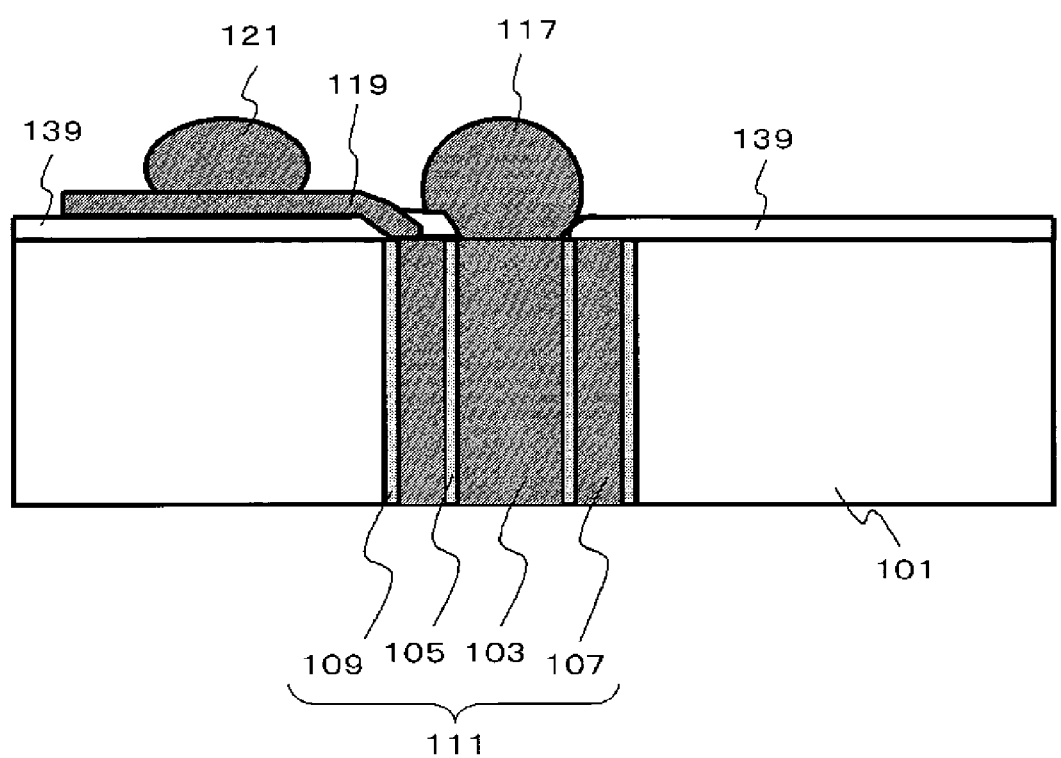
FIG. 7 is a cross-sectional view, schematically showing a configuration of a semiconductor device according to the embodiment of the present invention.
Figure 8:
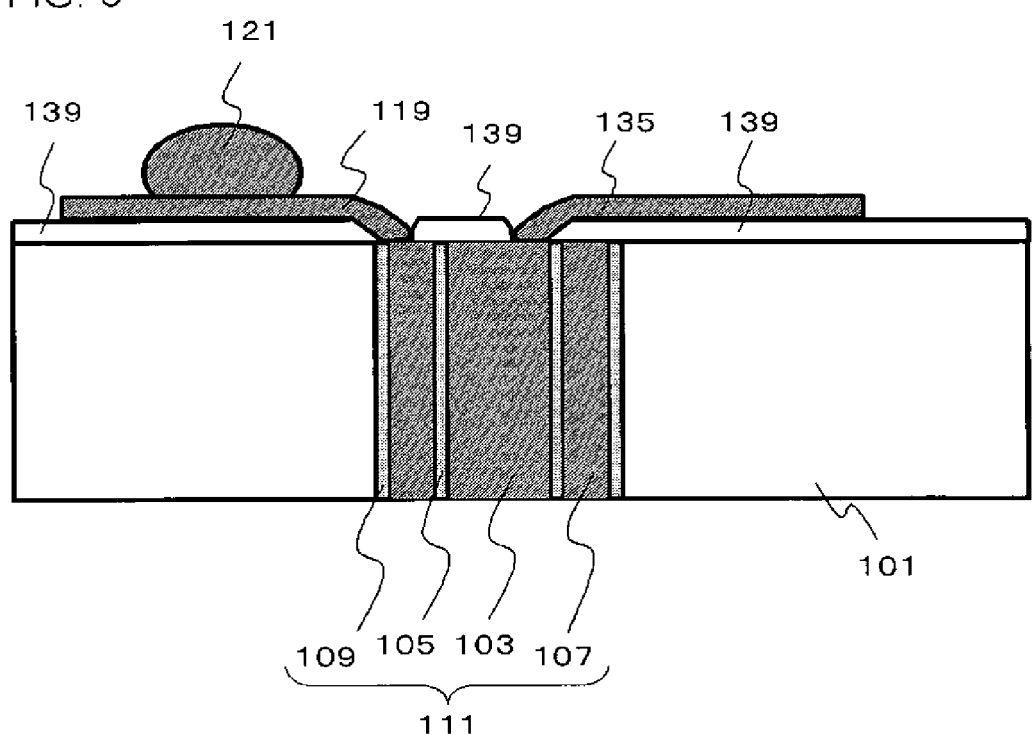
FIG. 8 is a cross-sectional view, schematically showing a configuration of a semiconductor device according to the embodiment of the present invention.
Figure 9:
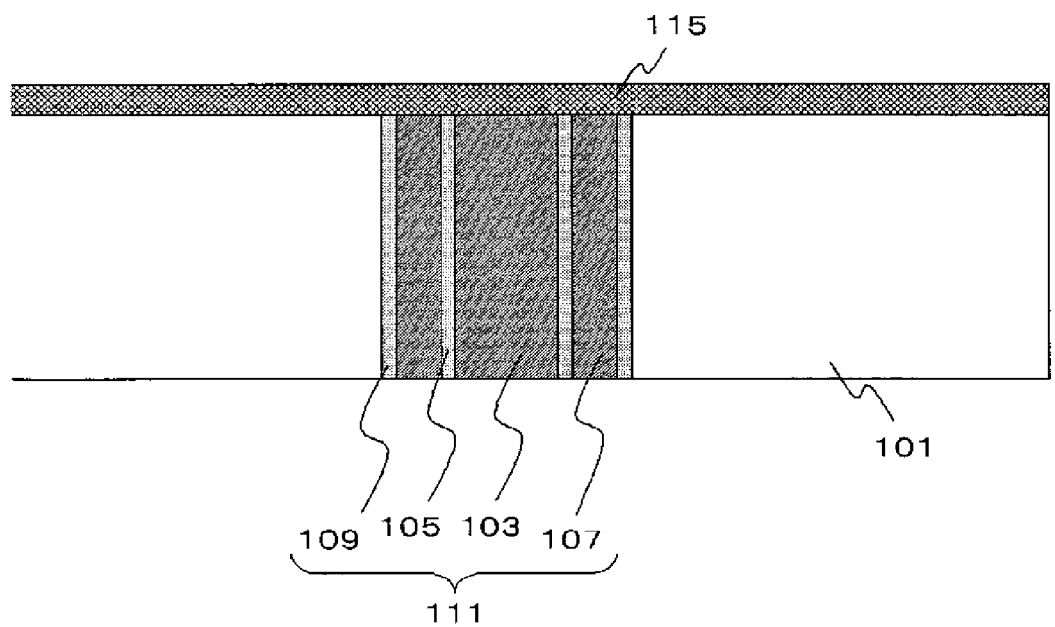
FIG. 9 is a cross-sectional view, schematically showing a configuration of a semiconductor device according to the embodiment of the present invention.

The present embodiment relates to an interconnect structure that employs the semiconductor device 100 described in the first embodiment. Firstly, a case that a single sided interconnect is provided will be described. FIG. 7 to FIG. 9 are the cross-sectional views, schematically showing a configuration of a semiconductor device, in which an interconnect is coupled to a multiplex through plug 111. While the configuration of providing one multiplex through plug 111 in the silicon substrate 101 is illustrated in FIG. 7 to FIG. 9, quantity and arrangement of the multiplex through plugs 111 may be suitably selected depending on the design of the device.

Firstly, a configuration of a semiconductor device shown in FIG. 7 will be described. The semiconductor device shown in FIG. 7 has a configuration, in which a multiplex through plug 111 is coupled to an inter-chip coupling terminal through one layer of an interconnect and is coupled to an inter-chip coupling terminal (a bump just above the through plug) directly. More specifically, the semiconductor device comprises the silicon substrate 101 provided with the multiplex through plug 111, a bump 117 coupled to an upper face of a first through electrode 103 on one face of the silicon substrate 101, an interconnect 119 coupled to a predetermined region of a second through electrode 107 on the same face as the bump 117 is coupled, and a bump 121 provided on the interconnect 119. The bump 117 and the bump 121 are employed as inter-chip coupling terminals.

In addition, regions of the upper face of the silicon substrate 101 except connecting portions of the second through electrode 107 with the interconnect 119 and connecting portions of the first through electrode 103 with the bump 117 are covered with an insulating film 139. The interconnect 119 elongates on the insulating film 139, and the gaps between the silicon substrate 101 and the interconnect 119 are insulated by an insulating film 139.

In the semiconductor device shown in FIG. 7, the second through electrode 107 provided outside of the multiplex through plug 111 may be composed with a material having higher resistance and higher capacitance than the material for composing the first through electrode 103 provided in the inside thereof. The second through electrode 107 is coupled to Vdd (not shown in the drawings) or GND (not shown in the drawings) through the interconnect 119. Here, the electric potential of the second through electrode 107 may be fixed for the purpose of providing a shield. In addition, an interconnect may be coupled from both sides of the second through electrode 107 to further utilize for supplying Vdd or GND.

In the semiconductor device shown in FIG. 7, the second through electrode 107 is coupled to Vdd or GND through the interconnect 119, so that Vdd or GND and the first through electrode 103 that is a signal pin can be provided in one multiplex through plug 111. Thus, an IR drop can be inhibited.

Further, in the semiconductor device shown in FIG. 7, the first through electrode 103 may also be employed, in addition to second through electrode 107, to provide a coupling to Vdd or GND. In this case, the first insulating film 105 may be composed of a material having higher specific dielectric constant. Having such configuration, a decoupling capacitor can be formed in the multiplex through plug 111. Thus, the main face of another semiconductor device may be coupled to the back face of the semiconductor device shown in FIG. 7, or in other words, to a face opposite to the forming face of the insulating film 139, such that the capacitor can be mounted directly above the circuit at an extremely short distance therefrom. In addition, the material and the thickness of the first insulating film 105 may be suitably adjusted according to the design of the semiconductor device to achieve an impedance-match of the signal interconnect.

Next, a semiconductor device shown in FIG. 8 will be described. The semiconductor device shown in FIG. 8 has a configuration, in which a multiplex through plug 111 is coupled to an inter-chip coupling terminal through a mono-layered interconnect. More specifically, the semiconductor device comprises a silicon substrate 101 provided with the multiplex through plug 111, an interconnect 135 electrically coupled to a first through electrode 103 on one face of the silicon substrate 101, an interconnect 119 coupled to a second through electrode 107 on the same face as the interconnect 135 is coupled, and a bump 121 provided on the interconnect 119. In addition, regions of the upper face of the silicon substrate 101 except connecting portions of the second through electrode 107 with the interconnect 119 and connecting portions of the first through electrode 103 with the interconnect 135 are covered with an insulating film 139. Similar advantageous effect as obtained by employing the semiconductor device shown in FIG. 7 can also be obtained by employing the semiconductor device shown in FIG. 8.

Next, a semiconductor device shown in FIG. 9 will be described. The semiconductor device shown in FIG. 9 comprises a multi-layered interconnect layer 115, which is coupled to one face of a multiplex through plug 111. The interconnect layer 115 has a configuration, in which interconnects are provided within an insulating film, as described in the first embodiment, and a first through electrode 103 and a second insulating film 109 are respectively connected to different interconnects in the interconnect layer 115 (not shown in the drawings). Similar advantageous effect as obtained by employing the semiconductor device shown in FIG. 7 or FIG. 8 can also be obtained by employing the semiconductor device shown in FIG. 9.

Figure 13:
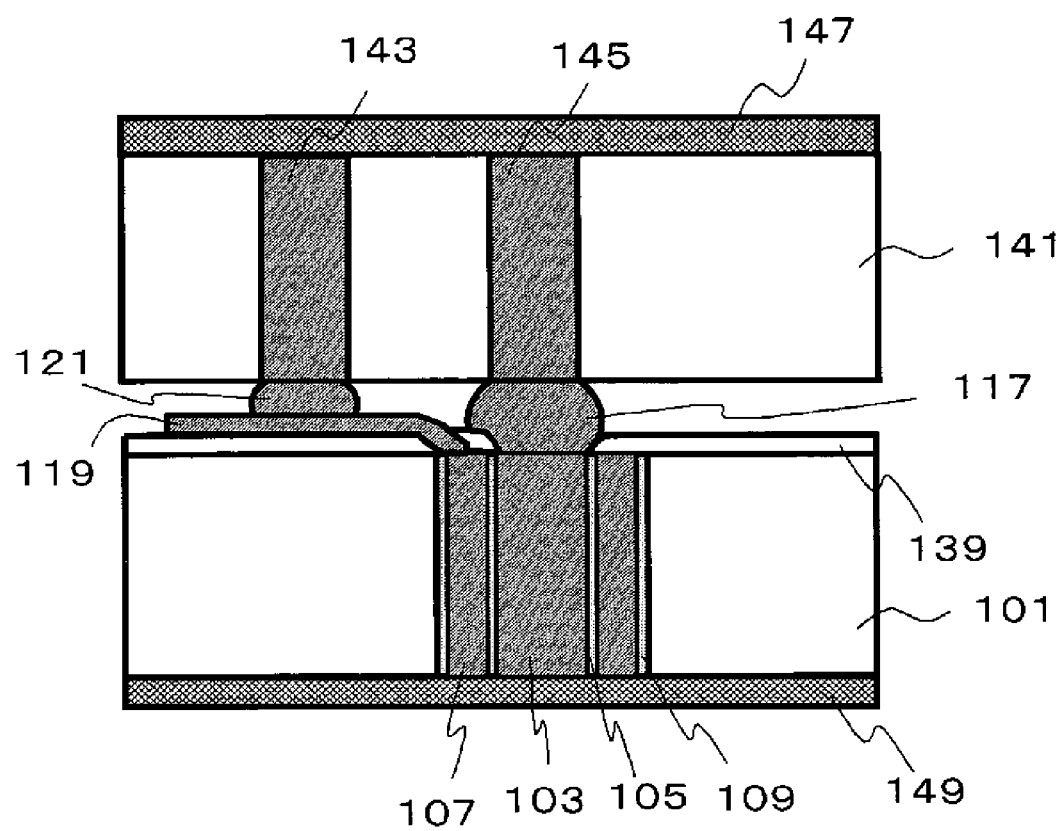
FIG. 13 is a cross-sectional view, schematically showing a configuration of a semiconductor device according to the embodiment of the present invention.

The semiconductor device described in the present embodiments may preferably be employed in the multi-chip modules. For example, a semiconductor module employing the semiconductor device shown in FIG. 7 may have a configuration shown in FIG. 13. In FIG. 13, other semiconductor device is coupled to an upper portion of the semiconductor device shown in FIG. 7. Other semiconductor device comprises a silicon substrate 141, an interconnect layer 147 (an interconnect layer is defined as a layer in which an interconnect is provided in an insulating layer) that covers an upper face of silicon substrate 141, or in other words, covers a face of the semiconductor device opposite to the coupling face thereof shown in FIG. 7, and a through plug 143 and a through plug 145 that extend through the silicon substrate 141 and are coupled to predetermined interconnects in the interconnect layer 147.

The through plug 145 is coupled through a bump 117 to the first through electrode 103. Similarly, the through plug 143 is coupled through a bump 121 to the second through electrode 107. In addition, a lower interconnect layer 149 (an interconnect layer is defined as a layer in which an interconnect is provided in an insulating layer) is provided on the bottom face of the silicon substrate 101, or in other words, on a face thereof opposite to the face for coupling to other semiconductor device. The first through electrode 103 and the second through electrode 107 are coupled to a predetermined interconnect in the lower interconnect layer 149.

Figure 14:
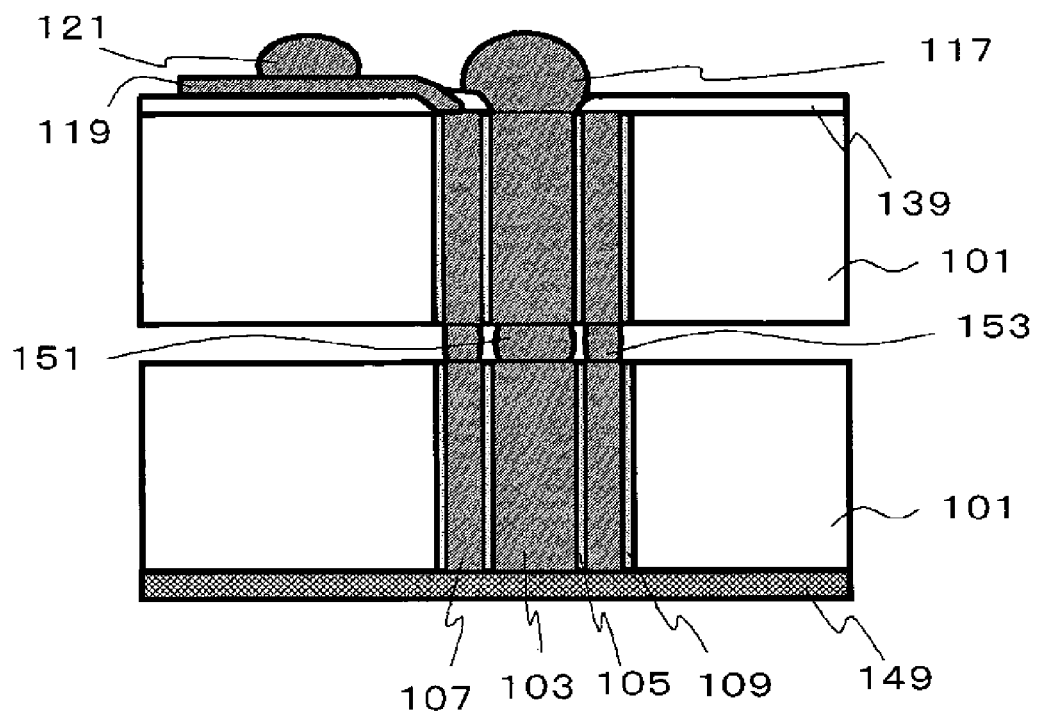
FIG. 14 is a cross-sectional view, schematically showing a configuration of a semiconductor device according to the embodiment of the present invention.

FIG. 14 illustrates an example, which is a combination of the semiconductor device shown in FIG. 7 and a semiconductor device described in the first embodiment (FIG. 2). Respective first through electrodes 103 of two semiconductor devices are mutually and electrically coupled through a bump 151. Similarly, the second through electrodes 103 are mutually and electrically coupled through a bump 153.

Figure 15:
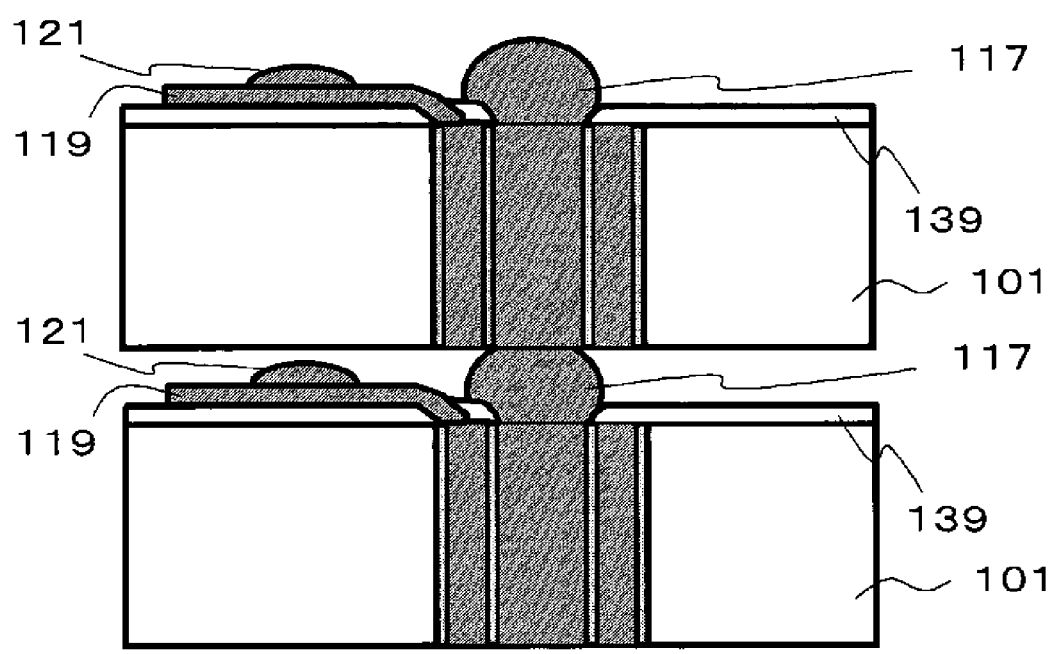
FIG. 15 is a cross-sectional view, schematically showing a configuration of a semiconductor device according to the embodiment of the present invention.

Further, as shown in FIG. 15, a plurality of (two, in FIG. 15) semiconductor devices shown in FIG. 7, for example, may be stacked to form a multi-chip module.

(Third Embodiment)

In the semiconductor device 100 described in the first embodiment, in the multiplex through plug 111 comprising a plurality of through electrodes in bamboo shoot-shaped disposed in a multiplex manner, includes the first through electrode 103 provided in the center of the multiplex through plug 111 that is a solid columnar component. In the present embodiment, a configuration of having a first through electrode 103 that is a pipe-shaped columnar component, center of which is filled with an insulating plug, will be described.

Figure 11:
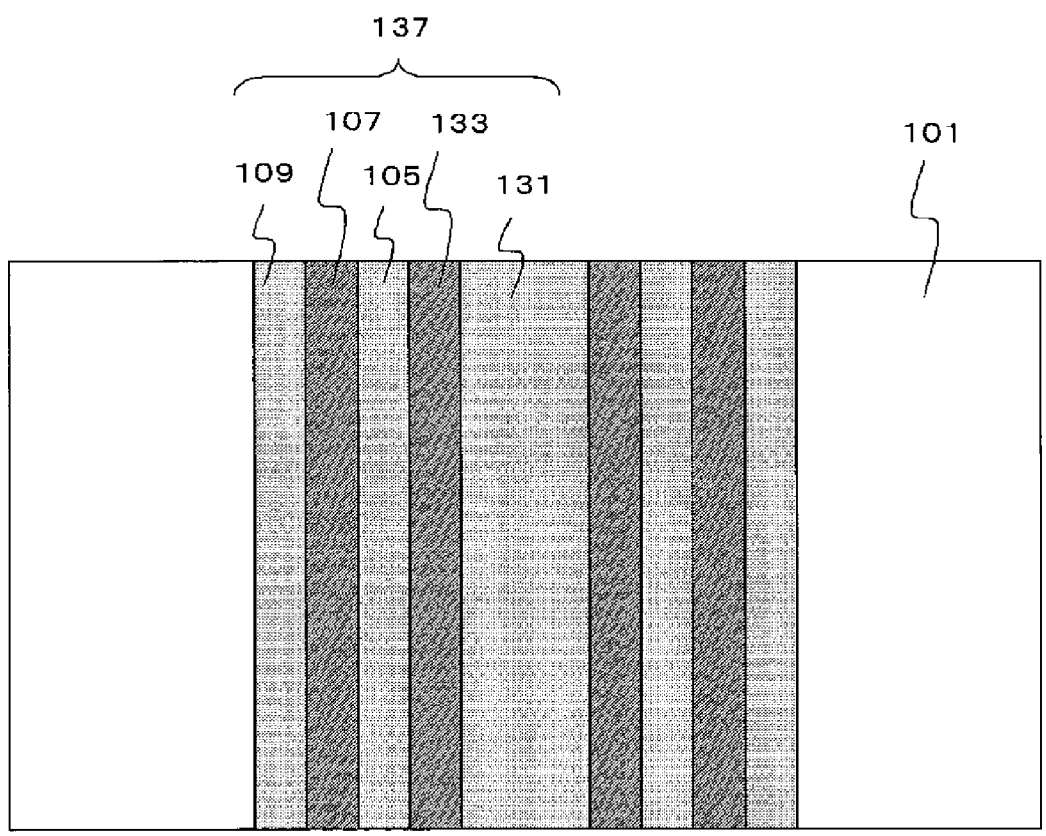
FIG. 11 is a cross-sectional view of the semiconductor device shown in FIG. 10 along a line B-B'.

FIG. 10 is a plan view, schematically showing a configuration of a semiconductor device 110 according to the present embodiment. FIG. 11 is a cross-sectional view of FIG. 10 along B-B'. A semiconductor device 110 shown in FIG. 10 and FIG. 11 has a multiplex through plug 137. A basic configuration of the multiplex through plug 137 is almost similar to the multiplex through plug 111 provided in the semiconductor device 100 shown in FIG. 1, except that a cylinder-shaped (cylindrical) first through electrode 133 and a column-shaped (columnar) third insulating film 131 filled in the inside of the first through electrode 133 are included, instead of the column-shaped (columnar) first through electrode 103.

In the semiconductor device 110 shown in FIG. 10 and FIG. 11, a material for the first through electrode 133 may be, for example, the material for the first through electrode 103 of the semiconductor device 100 described in the first embodiment. Thickness of the first through electrode 133 may be same as or different from that of the material of the second through electrode 107.

In semiconductor device 110, a material for the third insulating film 131 may be, for example, a nitride film such as SiN, SiON and the like, or an oxide film such as $SiO_2$ and the like. Further, an organic compound film such as polyimide may also be employed. The material for the third insulating film 131 may be same as or different from the material of the first insulating film 105 or the second insulating film 109.

While the configuration of providing two multiplex through plugs 137 on the silicon substrate 101 is illustrated in FIG. 10, number and arrangement of the multiplex through plugs 137 are not particularly limited, and may be suitably selected depending on the design of the semiconductor device 110. In addition, while the cross section of through electrode shown in FIG. 11 is rectangle, the cross section of through electrode may be shape that is not rectangle (for example, taper, reverse-taper and the like). Further, the two-dimensional shape of the cylindrical first through electrode 133 is not limited to rectangular shape. For example, the two-dimensional shape of the cylindrical first through electrode 133 may be a rectangle loop, an elliptic loop, a polygonal loop or the like. Further, the two-dimensional shape of the cylindrical second through electrode 107 is not limited to circular loop shape. For example, the two-dimensional shape of the cylindrical second through electrode 107 may be a rectangle, an elliptic loop, a polygonal loop or the like.

FIGS. 12A and 12B are cross-sectional views of the semiconductor device 110, schematically showing a process for manufacturing the semiconductor device 110 according to the present embodiment. Firstly, processes described in reference to FIG. 3A to FIG. 3C and FIG. 4A are performed to deposit the first insulating film 105 on the silicon substrate 101. Subsequently, the second electrically conductive film 164 that is a metal film, which will be the first through electrode 133, is deposited on the entire face of the upper face of the first insulating film 105 (FIG. 12A). Then, on the second electrically conductive film 164 that will be the first through electrode 133, a third insulating film 131 that covers the entire face of the second electrically conductive film 164 is deposited so as to fill in the opening 113 (FIG. 12B).

Then, a back face grinding process of the silicon substrate 101 is performed according to the process described in the first embodiment to obtain the multiplex through plug 137. In addition, an interconnect layer 115 (an interconnect layer is defined as a layer in which an interconnect is provided in an insulating layer) that covers the upper face of the multiplex through plug 137 may be provided, though it is not shown in FIG. 10 and FIG. 11.

The semiconductor device 110 shown in FIG. 10 and FIG. 11 comprises the multiplex through plug 137. Thus, similarly as in the case of the first embodiment, the through electrodes can be arranged at higher density while reducing the number of the required through holes. Further, the multiplex through plug 137 comprises a configuration of the multi-layered structure, which is sequentially formed, from the inner side toward the outside, of the third insulating film 131 having an axis that is identical to the central axis of opening 113, the first through electrode 133, the first insulating film 105, the second through electrode 107 and the second insulating film 109. Thus, the configuration that is capable of reducing parasitic capacitance can be presented, while simplifying the process for providing the metal film that will be the first through electrode 133.

The semiconductor device 110 may also preferably be applicable to various configurations of the semiconductor devices described in the first embodiment and the second embodiment, similarly as in the semiconductor device 100 (FIG. 1). For example, the semiconductor device 110 may be a memory LSI chip or a logic LSI chip. Further, the semiconductor device 110 may be applied to, for example, a silicon interposer, and a semiconductor chip is provided on both sides of the semiconductor device 110, so that the semiconductor chips can be connected each other. More specifically, a logic LSI chip and a memory LSI chip may be separately disposed on different faces of the semiconductor device 110.

While the embodiments of the present invention have been described above in reference to the annexed figures, it should be understood that the disclosures above are presented for the purpose of illustrating the present invention, and various configurations other than the above-described configurations can also be adopted. For example, while a semiconductor substrate comprising silicon is shown in above embodiments, a semiconductor substrate comprising other material (for example, GaAs and the like) may be used.

It is apparent that the present invention is not limited to the above embodiment, that may be modified and changed without departing from the scope and spirit of the invention.

What is claimed is:

1. A semiconductor device, comprising:
a semiconductor substrate;
a solid plug-shaped insulating plug extending through said semiconductor substrate;
a pipe-shaped first electrical conductor, covering a circumference of said insulating plug, and extending through said semiconductor substrate;
a pipe-shaped second electrical conductor, being provided in a circumference of said first electrical conductor, and extending through said semiconductor substrate; and
an insulating film, being provided between said first electrical conductor and said second electrical conductor, and providing an electrical insulation between said first electrical conductor and said second electrical conductor.

2. The semiconductor device according to claim 1, wherein said first electrical conductor is composed of a material, which is different from a material for composing said second electrical conductor.

3. The semiconductor device according to claim 1, wherein one or more pipe-shaped electrical conductors containing at least said second electrical conductor are formed through the insulating film in the circumference of said first electrical conductor by taking a central axis of a through hole extending through said semiconductor substrate as an axis of said one or more pipe-shaped electrical conductors, and a material of the outermost pipe-shaped electrical conductor among said one or more pipe-shaped electrical conductors is a material having the highest melting point among a material for said first electrical conductor and materials for said one or more pipe-shaped electrical conductors.

4. The semiconductor device according to claim 1, further comprising an extra semiconductor substrate provided with a conductive component, which is coupled to said first electrical conductor or said second electrical conductor provided in said semiconductor substrate.

5. The semiconductor device according to claim 1, further comprising a through electrode comprising said first electrical conductor and said second electrical conductor, wherein an electric potential of said second electrical conductor is fixed at a supply potential or a ground potential, and said second electrical conductor is electrically coupled to a ground plane covering said semiconductor device.

6. The semiconductor device according to claim 1, further comprising an outer insulating film, which is provided between said second electrical conductor and said semiconductor substrate and separates between said second electrical conductor and said semiconductor substrate.

7. The semiconductor device according to claim 1, wherein a geometry of said outer insulating film is a cylindrical component extending through said semiconductor substrate.

8. The semiconductor device according to claim 1, wherein said first electrical conductor and said second electrical conductor are electrically coupled to different interconnects respectively.

* * * * *